(12) United States Patent
Suzuki et al.

(10) Patent No.: US 11,871,579 B2
(45) Date of Patent: Jan. 9, 2024

(54) SEMICONDUCTOR MEMORY DEVICE HAVING FERROELECTRIC GATE INSULATING LAYER

(71) Applicant: Kioxia Corporation, Tokyo (JP)

(72) Inventors: Kunifumi Suzuki, Yokkaichi (JP); Yuuichi Kamimuta, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 129 days.

(21) Appl. No.: 17/447,352

(22) Filed: Sep. 10, 2021

(65) Prior Publication Data

US 2022/0302170 A1 Sep. 22, 2022

(30) Foreign Application Priority Data

Mar. 19, 2021 (JP) ................. 2021-046295

(51) Int. Cl.
*H10B 51/20* (2023.01)
*H01L 29/51* (2006.01)
*H10B 43/20* (2023.01)
*H10B 51/30* (2023.01)
*H10B 43/30* (2023.01)

(52) U.S. Cl.
CPC .......... *H10B 51/20* (2023.02); *H01L 29/516* (2013.01); *H01L 29/517* (2013.01); *H10B 43/20* (2023.02); *H10B 43/30* (2023.02); *H10B 51/30* (2023.02)

(58) Field of Classification Search
CPC ..... H01L 29/516; H01L 29/517; H10B 43/10; H10B 43/20; H10B 43/30; H10B 51/10; H10B 51/20; H10B 51/30
See application file for complete search history.

(56) References Cited

U.S. PATENT DOCUMENTS

| 10,211,223 | B2 | 2/2019 | Van Houdt et al. |
| 10,249,818 | B1 | 4/2019 | Yamaguchi et al. |
| 2019/0006011 | A1* | 1/2019 | Oh .................. H10B 43/27 |
| 2019/0006386 | A1* | 1/2019 | Yamazaki .......... H10B 63/845 |
| 2019/0088664 | A1 | 3/2019 | Kabuyanagi et al. |

(Continued)

FOREIGN PATENT DOCUMENTS

| CN | 109216370 A | 1/2019 |
| CN | 111081713 A | 4/2020 |

(Continued)

*Primary Examiner* — Matthew E Warren
(74) *Attorney, Agent, or Firm* — Oblon, McClelland, Maier & Neustadt, L.L.P.

(57) ABSTRACT

A semiconductor memory device of an embodiment includes: a semiconductor layer extending in a first direction; a first gate electrode layer; a second gate electrode layer provided apart from the first gate electrode layer in the first direction; and a gate insulating layer containing oxygen and at least one metal element of hafnium or zirconium, the gate insulating layer including a first region between the first gate electrode layer and the semiconductor layer, a second region between the first gate electrode layer and the second gate electrode layer, and a third region between the second gate electrode layer and the semiconductor layer, the first region including a crystal of an orthorhombic crystal system or a trigonal crystal system as a main constituent substance, and a distance between the second region and the semiconductor layer being larger than a distance between the first region and the semiconductor layer.

9 Claims, 34 Drawing Sheets

(56) References Cited

U.S. PATENT DOCUMENTS

| | | |
|---|---|---|
| 2020/0091160 A1 | 3/2020 | Ino et al. |
| 2020/0119047 A1* | 4/2020 | Yoo .................. H01L 29/40111 |
| 2020/0127126 A1 | 4/2020 | Lee |
| 2020/0227432 A1 | 7/2020 | Lai et al. |
| 2020/0227727 A1 | 7/2020 | Li |
| 2020/0303558 A1 | 9/2020 | Fujii |
| 2020/0402994 A1 | 12/2020 | Yang et al. |
| 2021/0057437 A1* | 2/2021 | Surthi ............... H01L 21/02164 |
| 2021/0082957 A1 | 3/2021 | Sakuma et al. |

FOREIGN PATENT DOCUMENTS

| | | | | |
|---|---|---|---|---|
| CN | 112103294 | A | 12/2020 | |
| JP | 2020-505790 | A | 2/2020 | |
| JP | 2020-155644 | A | 9/2020 | |
| JP | 2021-048214 | A | 3/2021 | |
| KR | 20210102981 | A * | 8/2021 | ............ H10B 43/27 |
| TW | 202027261 | A | 7/2020 | |
| TW | 202036849 | A | 10/2020 | |
| WO | WO 2018/136734 | A1 | 7/2018 | |
| WO | WO 2019/125352 | A1 | 6/2019 | |

* cited by examiner

BB' CROSS SECTION

AA' CROSS SECTION

1

SEMICONDUCTOR MEMORY DEVICE HAVING FERROELECTRIC GATE INSULATING LAYER

CROSS-REFERENCE TO RELATED APPLICATION

This application is based upon and claims the benefit of priority from Japanese Patent Application No. 2021-046295, filed on Mar. 19, 2021, the entire contents of which are incorporated herein by reference.

FIELD

Embodiments described herein relate generally to a semiconductor memory device.

BACKGROUND

Ferroelectric memory attracts attention as a nonvolatile memory. For example, there is a three-terminal memory of ferroelectric field effect transistor (FeFET) type, in which a ferroelectric layer is applied to the gate insulating layer of a field effect transistor (FET) type transistor to modulate the threshold voltage of the transistor. The threshold voltage of the transistor is modulated by changing the polarization state of the ferroelectric layer.

A three-dimensional NAND flash memory in which memory cells are three-dimensionally disposed achieves high integration and low cost. In the three-dimensional NAND flash memory, a memory hole penetrating a stacked body is formed in the stacked body in which, for example, a plurality of insulating layers and a plurality of gate electrode layers are alternately stacked. By applying a three-terminal memory of FeFET type as a memory cell of the three-dimensional NAND flash memory, the gate insulating layer can be thinned. Therefore, it is possible to reduce the hole diameter of the memory hole, and it is possible to scale-down the memory cell. Therefore, by applying the three-terminal memory of FeFET type, it is possible to further increase the integration of the memory. It is desired to achieve a three-dimensional NAND flash memory stably operating even when the memory cell is scaled-down.

DETAILED DESCRIPTION

Figure 1:
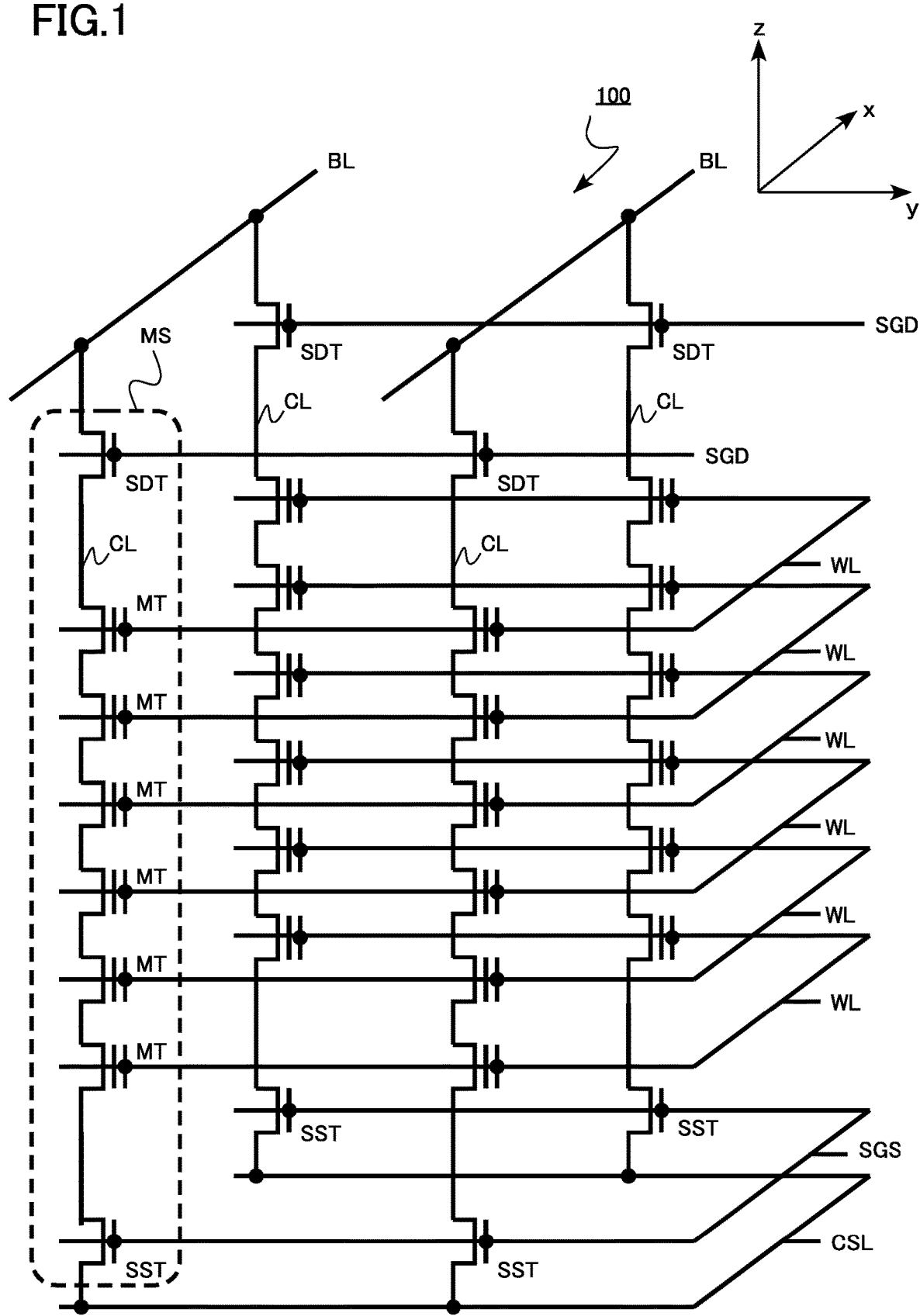
FIG. 1 is a circuit diagram of a memory cell array of a semiconductor memory device of a first embodiment.

A semiconductor memory device of an embodiment includes: a semiconductor layer extending in a first direction; a first gate electrode layer; a second gate electrode layer provided in the first direction apart from the first gate electrode layer; and a gate insulating layer containing at least one metal element of hafnium (Hf) and zirconium (Zr) and oxygen (O), the gate insulating layer including a first region between the first gate electrode layer and the semiconductor layer, a second region between the first gate electrode layer and the second gate electrode layer, and a third region between the second gate electrode layer and the semiconductor layer, the gate insulating layer in which the first region has a crystal of an orthorhombic crystal system or a trigonal crystal system as a main constituent substance, and a distance between the second region and the semiconductor layer is larger than a distance between the first region and the semiconductor layer.

Embodiments will be described below with reference to the drawings. In the following description, the identical or similar members are given the identical reference numerals, and description of the members once described will sometimes be omitted as appropriate.

In the present description, the term "up" or "down" is sometimes used for convenience. The term "up" or "down" is merely a term indicating a relative positional relationship in the drawings, and is not a term defining a positional relationship with respect to gravity.

Qualitative analysis and quantitative analysis of the chemical composition of the members constituting the semiconductor memory device in the present description can be carried out by, for example, secondary ion mass spectroscopy (SIMS), energy dispersive X-ray spectroscopy (EDX), electron energy loss spectroscopy (EELS), or the like. For example, a transmission electron microscope (TEM) can be used to measure the thickness of the members constituting the semiconductor memory device, the distance between the members, and the like. For identification of the crystal systems of constituent substances of the members constituting the semiconductor memory device and comparison of the abundance ratio of the crystal systems, it is possible to use, for example, a transmission electron microscope, X-ray diffraction (XRD), electron beam diffraction (EBD), X-ray photoelectron spectroscopy (XPS), or synchrotron radiation X-ray absorption fine structure (XAFS).

The "ferroelectric" in the present description means a substance having a spontaneous polarization even without an electric field applied from outside and having the polarization reversed when an electric field is applied from outside. The "paraelectric" in the present description means a substance having a polarization occurring when an electric field is applied and having the polarization disappearing when the electric field is removed.

First Embodiment

A semiconductor memory device of the first embodiment includes: a semiconductor layer extending in a first direction; a first gate electrode layer; a second gate electrode layer provided in the first direction apart from the first gate electrode layer; and a gate insulating layer containing at least one metal element of hafnium (Hf) and zirconium (Zr) and oxygen (O), the gate insulating layer including a first region between the first gate electrode layer and the semiconductor layer, a second region between the first gate electrode layer and the second gate electrode layer, and a third region between the second gate electrode layer and the semiconductor layer, the gate insulating layer in which the first region has a crystal of an orthorhombic crystal system or a trigonal crystal system as a main constituent substance, and a distance between the second region and the semiconductor layer is larger than a distance between the first region and the semiconductor layer.

The semiconductor memory device of the first embodiment is a three-dimensional NAND flash memory having a memory cell of a metal ferroelectrics semiconductor structure (MFS structure).

FIG. 1 is a circuit diagram of the memory cell array of the semiconductor memory device of the first embodiment.

As shown in FIG. 1, a memory cell array 100 of the three-dimensional NAND flash memory of the first embodiment includes a plurality of word lines WL, a common source line CSL, a source selection gate line SGS, a plurality of channel layers CL, a plurality of drain selection gate lines SGD, a plurality of bit lines BL, and a plurality of memory strings MS.

The z direction in FIG. 1 is an example of the first direction. The y direction in FIG. 1 is an example of the second direction. The x direction in FIG. 1 is an example of the third direction. Note that the first direction is a concept including the z direction and the opposite direction. The second direction is a concept including the y direction and the opposite direction. The third direction is a concept including the x direction and the opposite direction.

The plurality of word lines WL are stacked in the z direction. The plurality of word lines WL are provided apart from each other in the z direction. The plurality of channel layers CL extend in the z direction. The plurality of bit lines BL extend in the x direction.

As shown in FIG. 1, the memory string MS includes a source selection transistor SST, a plurality of memory cell transistors MT, and a drain selection transistor SDT, which are connected in series between the common source line CSL and the bit line BL. One memory string MS is selected by the bit line BL and the drain selection gate line SGD, and one memory cell transistor MT can be selected by the word line WL.

Figure 2A:
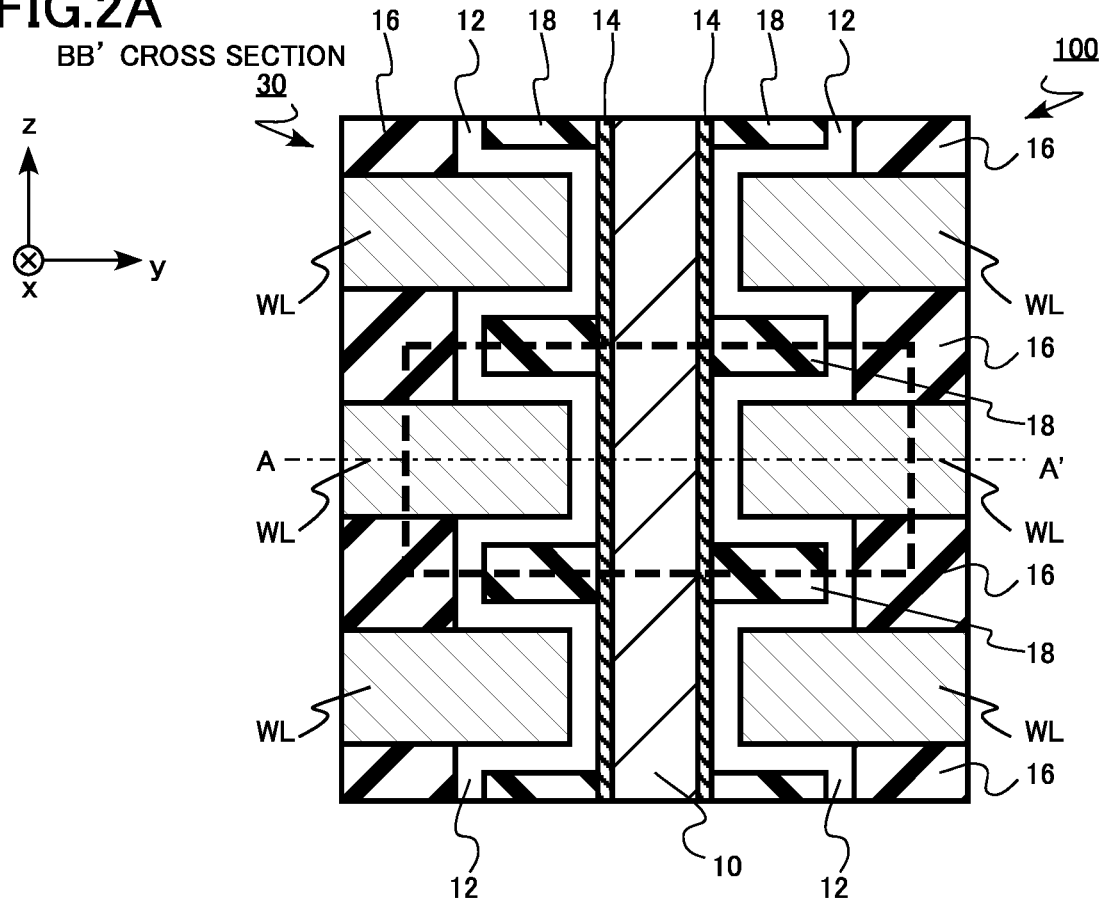
FIGS. 2A and 2B are schematic cross-sectional views of the memory cell array of the semiconductor memory device of the first embodiment.
Figure 2B:
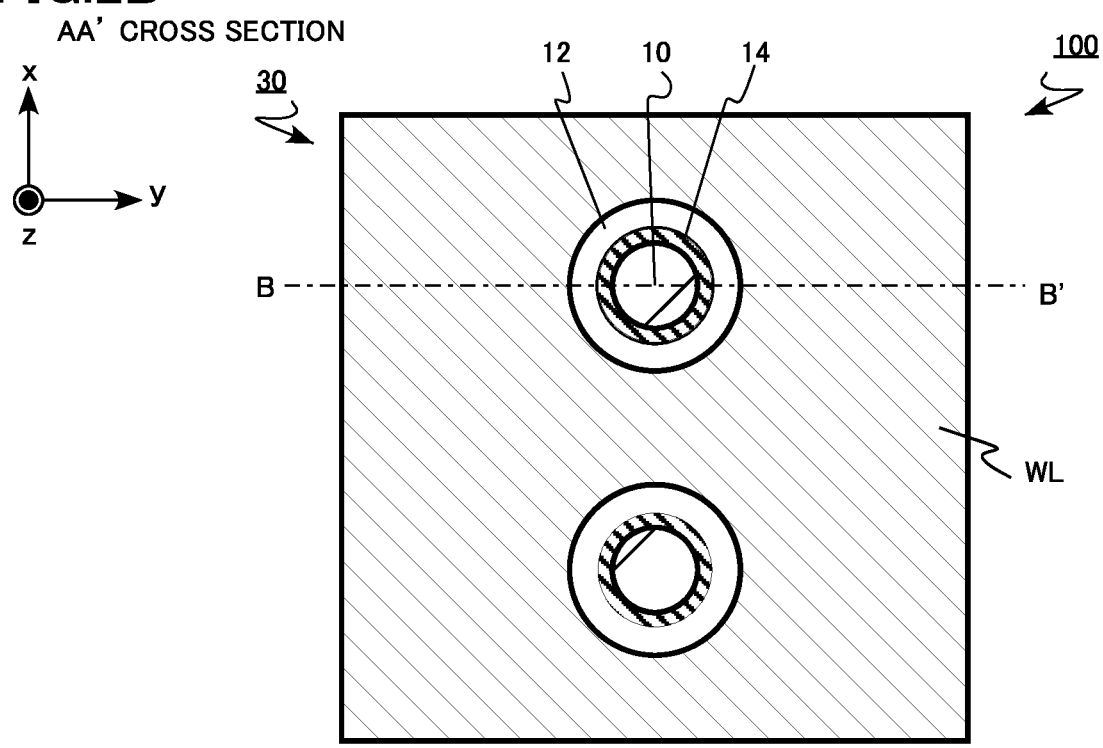

FIGS. 2A and 2B are schematic cross-sectional views of the memory cell array of the semiconductor memory device of the first embodiment. FIGS. 2A and 2B show a cross section of a plurality of memory cells in one memory string MS enclosed by a dotted line, for example, in the memory cell array 100 of FIG. 1.

FIG. 2A is a yz cross-sectional view of the memory cell array 100. FIG. 2A is a BB' cross section of FIG. 2B. FIG. 2B is an xy cross-sectional view of the memory cell array 100. FIG. 2B is an AA' cross section of FIG. 2A. In FIG. 2A, a region enclosed by a broken line is one memory cell.

Figure 3:
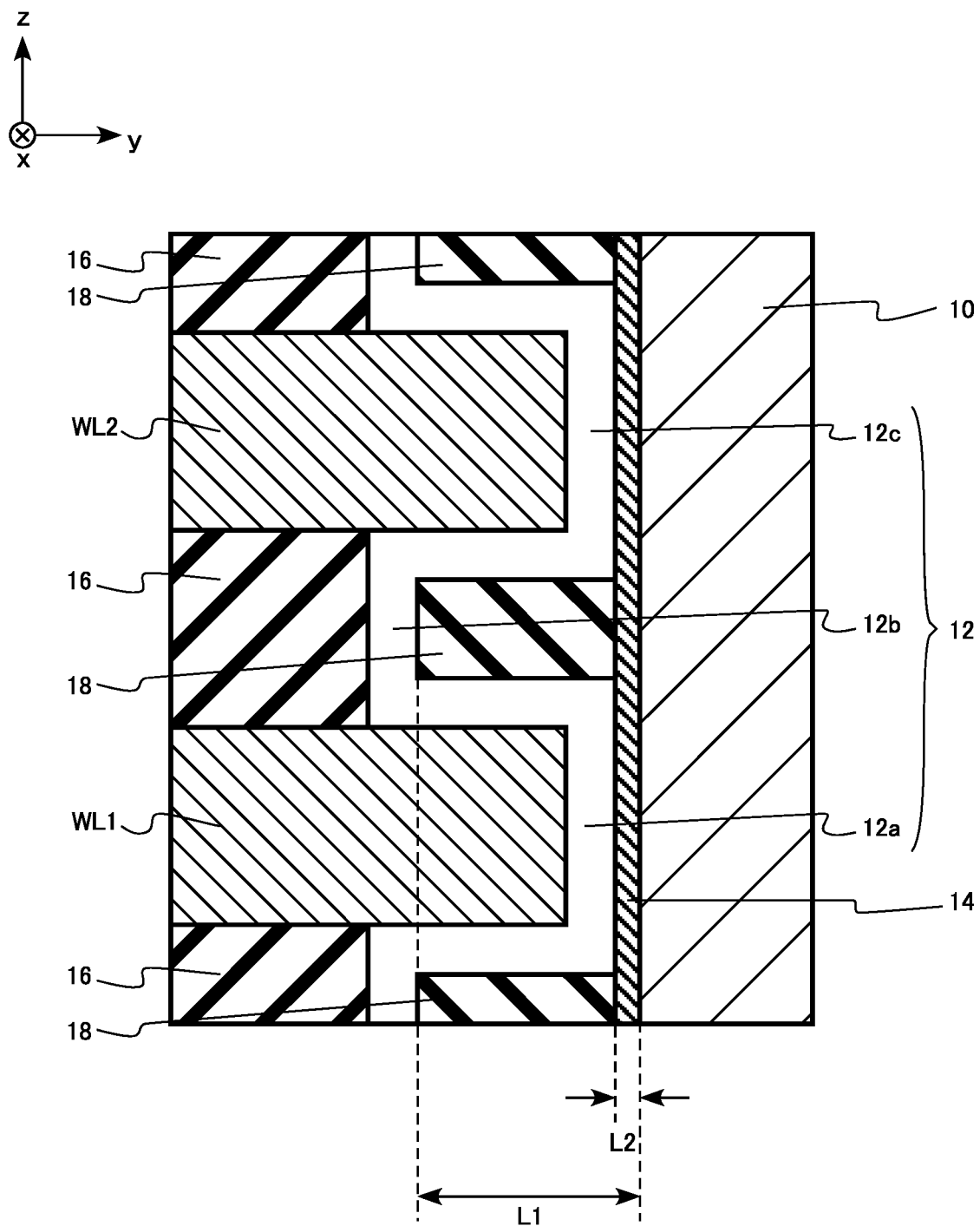
FIG. 3 is a schematic cross-sectional view of a memory cell of the semiconductor memory device of the first embodiment.

FIG. 3 is a schematic cross-sectional view of the memory cell of the semiconductor memory device of the first embodiment. FIG. 3 is an enlarged cross-sectional view of a part of two memory cells.

As shown in FIGS. 2A and 2B, the memory cell array 100 includes the plurality of word lines WL, a semiconductor layer 10, a gate insulating layer 12, an interface insulating layer 14, a plurality of first interlayer insulating layers 16, and a plurality of second interlayer insulating layers 18. The plurality of word lines WL and the plurality of first interlayer insulating layers 16 constitute a stack body 30.

The interface insulating layer 14 is an example of the first insulating layer. The second interlayer insulating layer 18 is an example of the second insulating layer.

As shown in FIG. 3, the two memory cells include a first word line WL1, a second word line WL2, the semiconductor layer 10, the gate insulating layer 12, the interface insulating layer 14, the first interlayer insulating layer 16, and the second interlayer insulating layer 18. The gate insulating layer 12 includes a first region 12a, a second region 12b, and a third region 12c.

The first word line WL1 is one of the plurality of word lines. The first word line WL1 is an example of the first gate electrode layer. The second word line WL2 is one of the plurality of word lines. The second word line WL2 is an example of the second gate electrode layer.

The word line WL and the first interlayer insulating layer 16 are provided on a semiconductor substrate not illustrated, for example.

The word lines WL and the first interlayer insulating layers 16 are alternately stacked on the semiconductor substrate in the z direction. The word lines WL are disposed apart from each other in the z direction. For example, the second word line WL2 is provided apart from the first word line WL1 in the z direction. The plurality of word lines WL and the plurality of first interlayer insulating layers 16 constitute a stack body 30.

The word line WL is, for example, a plate-like conductor. The word line WL is, for example, a metal, a metal nitride, a metal carbide, or a semiconductor. The word line WL is tungsten (W), for example. The word line WL functions as a control electrode of the memory cell transistor MT.

The length of the word line WL in the z direction is, for example, equal to or more than 5 nm and equal to or less than 40 nm.

The first interlayer insulating layer 16 separates the word line WL from the word line WL. The first interlayer insulating layer 16 separates, for example, the first word line WL1 from the second word line WL2. The first interlayer insulating layer 16 is, for example, an oxide, an oxynitride, or a nitride. The first interlayer insulating layer 16 is silicon oxide, for example.

The length of the first interlayer insulating layer 16 in the z direction is, for example, equal to or more than 5 nm and equal to or less than 40 nm.

The semiconductor layer 10 is provided in the stack body 30. The semiconductor layer 10 extends in the z direction. The semiconductor layer 10 is provided to penetrate the stack body 30. The semiconductor layer 10 is, for example, columnar or cylindrical. The semiconductor layer 10 corresponds to the channel layer CL.

The semiconductor layer 10 is, for example, a polycrystalline semiconductor. The semiconductor layer 10 is, for example, polycrystalline silicon. The semiconductor layer 10 functions as a channel of the memory cell transistor MT.

The gate insulating layer 12 is provided between the word line WL and the semiconductor layer 10. The gate insulating layer 12 contains at least one metal element of hafnium (Hf) and zirconium (Zr) and oxygen (O).

Hereinafter, for convenience of description, at least one metal element of hafnium (Hf) and zirconium (Zr) contained in the gate insulating layer 12 will sometimes be referred to as a main constituent metal element.

The atomic concentration of the main constituent metal element is the highest among the atomic concentrations of elements other than oxygen (O) contained in the gate insulating layer 12. The proportion of the atomic concentration of the main constituent metal element in the total atomic concentration of elements other than oxygen (O) contained in the gate insulating layer 12 is equal to or more than 90%, for example.

The gate insulating layer 12 includes oxide containing at least any one of hafnium oxide and zirconium oxide.

The gate insulating layer 12 contains, for example, hafnium oxide as a main component. Containing hafnium oxide as a main component means that the molar ratio of hafnium oxide is the highest among the substances contained in the gate insulating layer 12. The molar ratio of the hafnium oxide contained in the gate insulating layer 12 is equal to or more than 90%, for example.

The gate insulating layer 12 contains, for example, zirconium oxide as a main component. Containing zirconium oxide as a main component means that the molar ratio of zirconium oxide is the highest among the substances contained in the gate insulating layer 12.

The molar ratio of the zirconium oxide contained in the gate insulating layer 12 is, for example, equal to or more than 40% and equal to or less than 60%. The oxide contained in the gate insulating layer 12 is, for example, a mixed crystal of hafnium oxide and zirconium oxide.

Hafnium oxide has ferroelectricity when it is a crystal of an orthorhombic crystal system or a trigonal crystal system. Hafnium oxide is a ferroelectric when it is a crystal of an orthorhombic crystal system or a trigonal crystal system.

Hafnium oxide having ferroelectricity has ferroelectricity, for example, when it is a crystal of a third orthorhombic crystal system (orthorhombic III, space group $Pbc2_1$, space group number 29) or a trigonal crystal system (trigonal, space group R3m or P3 or R3, space group number 160 or 143 or 146).

Hafnium oxide does not have ferroelectricity when it is a crystal other than a crystal of the orthorhombic crystal system or the trigonal crystal system, or when the hafnium oxide is amorphous. Hafnium oxide is paraelectric when it is a crystal other than a crystal of the orthorhombic crystal system or the trigonal crystal system, or when the hafnium oxide is amorphous. The crystal system other than the orthorhombic crystal system or the trigonal crystal system means a cubic crystal system, a hexagonal crystal system, a tetragonal crystal system, a monoclinic crystal system, or a triclinic crystal system.

Zirconium oxide has ferroelectricity when it is a crystal of an orthorhombic crystal system or a trigonal crystal system. Zirconium oxide is a ferroelectric when it is a crystal of an orthorhombic crystal system or a trigonal crystal system.

Zirconium oxide having ferroelectricity has ferroelectricity, for example, when it is a crystal of a third orthorhombic crystal system (orthorhombic III, space group $Pbc2_1$, space group number 29) or a trigonal crystal system (trigonal, space group R3m or P3 or R3, space group number 160 or 143 or 146).

Zirconium oxide does not have ferroelectricity when it is a crystal other than a crystal of the orthorhombic crystal system or the trigonal crystal system, or when the hafnium oxide is amorphous. Zirconium oxide is paraelectric when it is a crystal other than a crystal of the orthorhombic crystal system or the trigonal crystal system, or when the hafnium oxide is amorphous.

The gate insulating layer 12 contains at least one additive element selected from the group consisting of, for example, silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The oxide contained in the gate insulating layer 12 contains the above-described additive element. If the oxide is hafnium oxide, by containing the above-mentioned additive element, ferroelectricity becomes likely to be expressed in the hafnium oxide.

The gate insulating layer 12 includes a first region 12a, a second region 12b, and a third region 12c.

The first region 12a is provided between the first word line WL1 and the semiconductor layer 10. The third region 12c is provided between the second word line WL2 and the semiconductor layer 10.

The first region 12a and the third region 12c have a crystal of the orthorhombic crystal system or the trigonal crystal system as a main constituent substance. Having a crystal of the orthorhombic crystal system or the trigonal crystal system as a main constituent substance means that a crystal of the orthorhombic crystal system or the trigonal crystal system exhibits the highest abundance ratio among the substances constituting the first region 12a and the third region 12c.

In the first region 12a and the third region 12c, the abundance ratio of the crystal of the orthorhombic crystal system or the trigonal crystal system is larger than the abundance ratio of a crystal other than the crystal of the orthorhombic crystal system and the trigonal crystal system or the amorphous phase. The abundance ratio is, for example, a molar ratio or a volume ratio. The first region 12a and the third region 12c are crystalline.

The first region 12a and the third region 12c are ferroelectrics. The oxide contained in the first region 12a and the third region 12c is a ferroelectric.

The first region 12a and the third region 12c having ferroelectricity function as a gate insulating layer of the FeFETs of the memory cell MC.

The second region 12b is provided between the first word line WL1 and the second word line WL2. The second region 12b has a crystal of the orthorhombic crystal system or the trigonal crystal system as a main constituent substance. The second region 12b is a ferroelectric. The second region 12b may be paraelectric.

The distance (L1 in FIG. 3) between the second region 12b and the semiconductor layer 10 is larger than the distance (L2 in FIG. 3) between the first region 12a and the semiconductor layer 10. The distance (L1 in FIG. 3) between the second region 12b and the semiconductor layer 10 is larger than, for example, the distance between the first word line WL1 and the semiconductor layer 10.

The interface insulating layer 14 is provided between the gate insulating layer 12 and the semiconductor layer 10. The interface insulating layer 14 is provided between the first word line WL1 and the semiconductor layer 10. The interface insulating layer 14 is provided between the second word line WL2 and the semiconductor layer 10.

The material of the interface insulating layer 14 is different from the material of the gate insulating layer 12, for example. The interface insulating layer 14 is, for example, an oxide, an oxynitride, or a nitride. The Interface insulating layer 14 is silicon oxide, for example.

The thickness of the interface insulating layer 14 in the y direction is thinner than the thickness of the gate insulating layer 12 in the y direction, for example.

With the interface insulating layer 14 omitted, the gate insulating layer 12 can be in direct contact with the semiconductor layer 10.

The second interlayer insulating layer 18 is provided between the second region 12b of the gate insulating layer 12 and the interface insulating layer 14. The second interlayer insulating layer 18 is provided between the second region 12b of the gate insulating layer 12 and the semiconductor layer 10. The second interlayer insulating layer 18 is provided between the first interlayer insulating layer 16 and the semiconductor layer 10. The second region 12b is provided between the second interlayer insulating layer 18 and the first interlayer insulating layer 16.

The material of the second interlayer insulating layer 18 is different from the material of the gate insulating layer 12. The second interlayer insulating layer 18 is, for example, an oxide, an oxynitride, or a nitride. The second interlayer insulating layer 18 is silicon oxide, for example.

The thickness of the second interlayer insulating layer 18 in the y direction is larger than the thickness of the gate insulating layer 12 in the y direction, for example.

In the memory cell of the first embodiment, the polarization inversion state of the ferroelectric included in the first region 12a of the gate insulating layer 12 is controlled by the voltage applied between the first word line WL and the semiconductor layer 10. The threshold voltage of the memory cell transistor MT varies depending on the polarization inversion state of the first region 12a. When the threshold voltage of the memory cell transistor MT varies, the on-state current of the memory cell transistor MT varies. For example, if a state where the threshold voltage is high and the on-state current is low is defined as data "0" and a state where the threshold voltage is low and the on-state current is high is defined as data "1", the memory cell can store 1-bit data of "0" and "1".

Next, an example of the manufacturing method of the semiconductor memory device of the first embodiment will be described. FIGS. 4 to 11 are schematic cross-sectional views showing the manufacturing method of the semiconductor memory device of the first embodiment. FIGS. 4 to 11 each shows a cross section corresponding to FIG. 2A. FIGS. 4 to 11 show an example of a manufacturing method of the memory cell array 100 of the semiconductor memory device.

Figure 4:
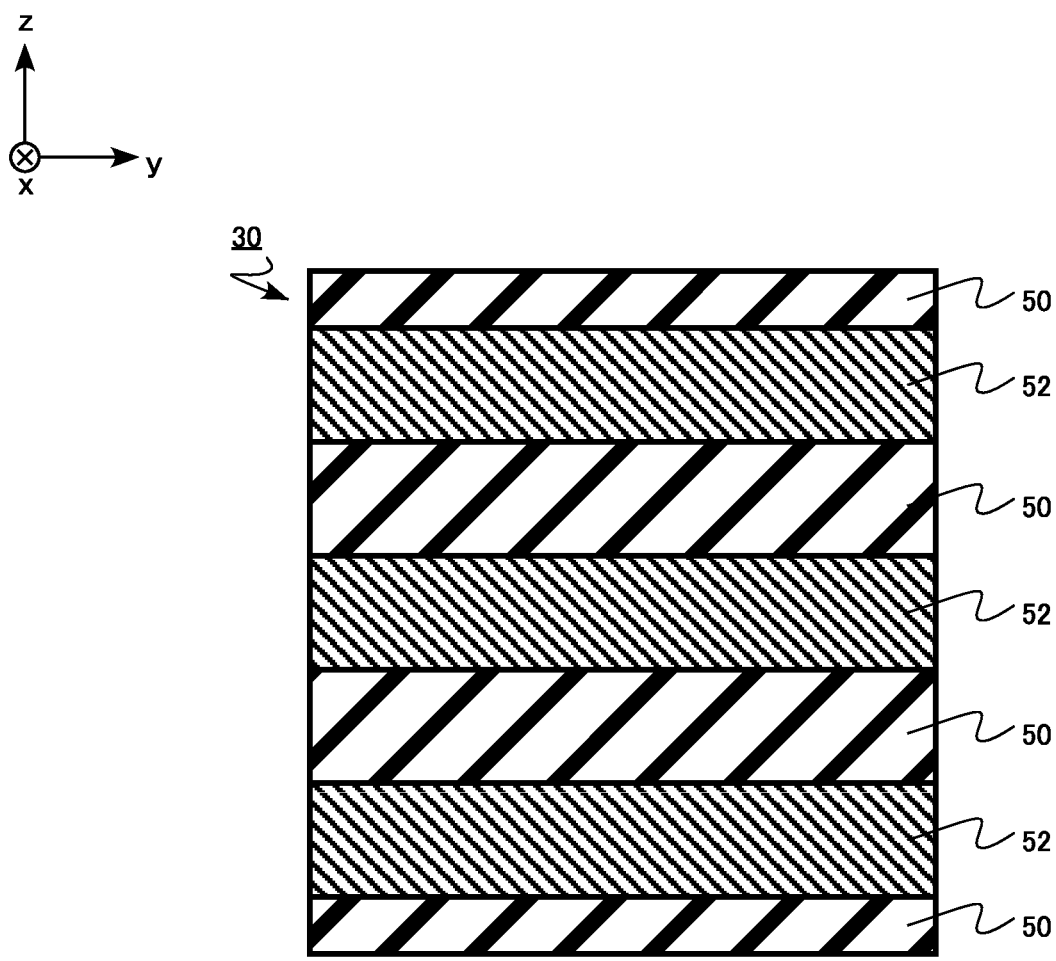
FIG. 4 is a schematic cross-sectional view showing a manufacturing method of the semiconductor memory device of the first embodiment.

First, a silicon oxide layer 50 and a silicon nitride layer 52 are alternately stacked on a semiconductor substrate not illustrated (FIG. 4). The silicon oxide layer 50 and the silicon nitride layer 52 form the stack body 30. The silicon oxide layer 50 and the silicon nitride layer 52 are formed by, for example, the chemical vapor deposition method (CVD method). A part of the silicon oxide layer 50 eventually becomes the first interlayer insulating layer 16.

Figure 5:
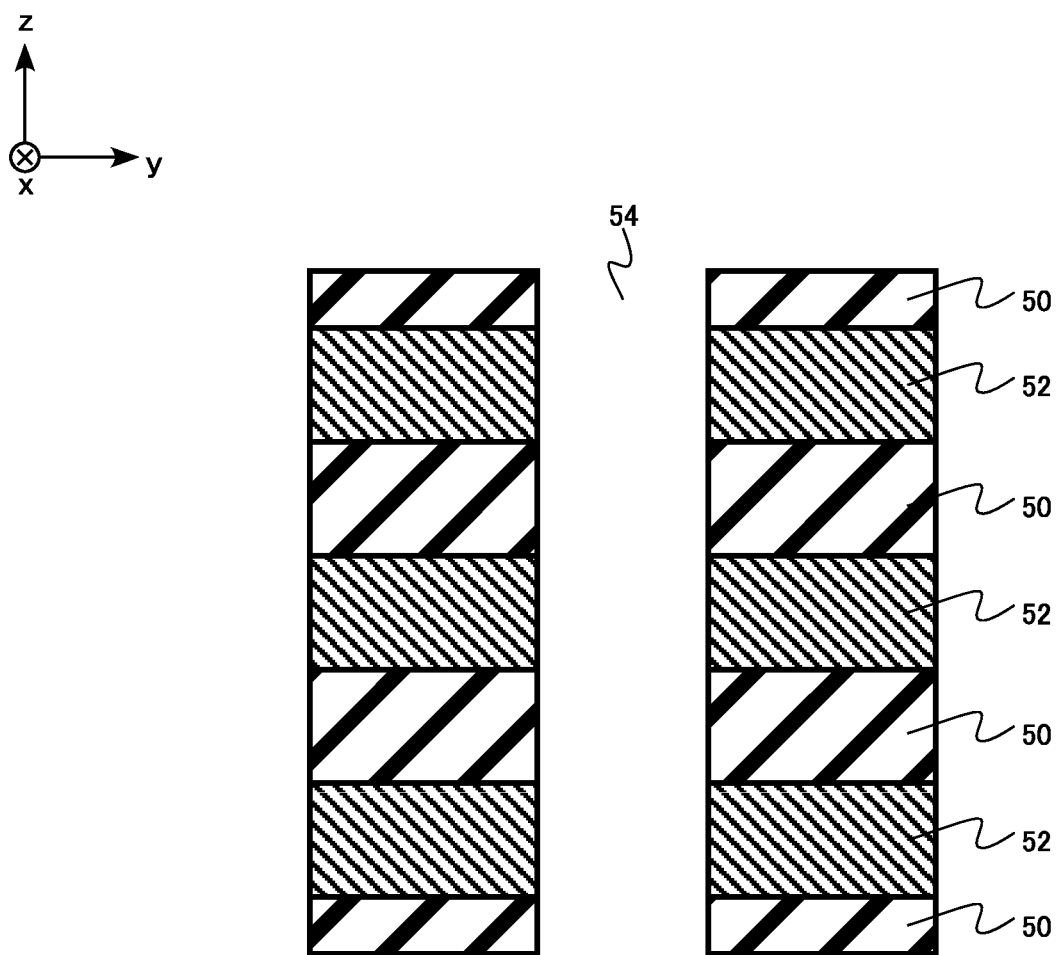
FIG. 5 is a schematic cross-sectional view showing the manufacturing method of the semiconductor memory device of the first embodiment.

Next, an opening 54 is formed in the silicon oxide layer 50 and the silicon nitride layer 52 (FIG. 5). The opening 54 is formed by, for example, the lithography method and the reactive ion etching method (RIE method).

Figure 6:
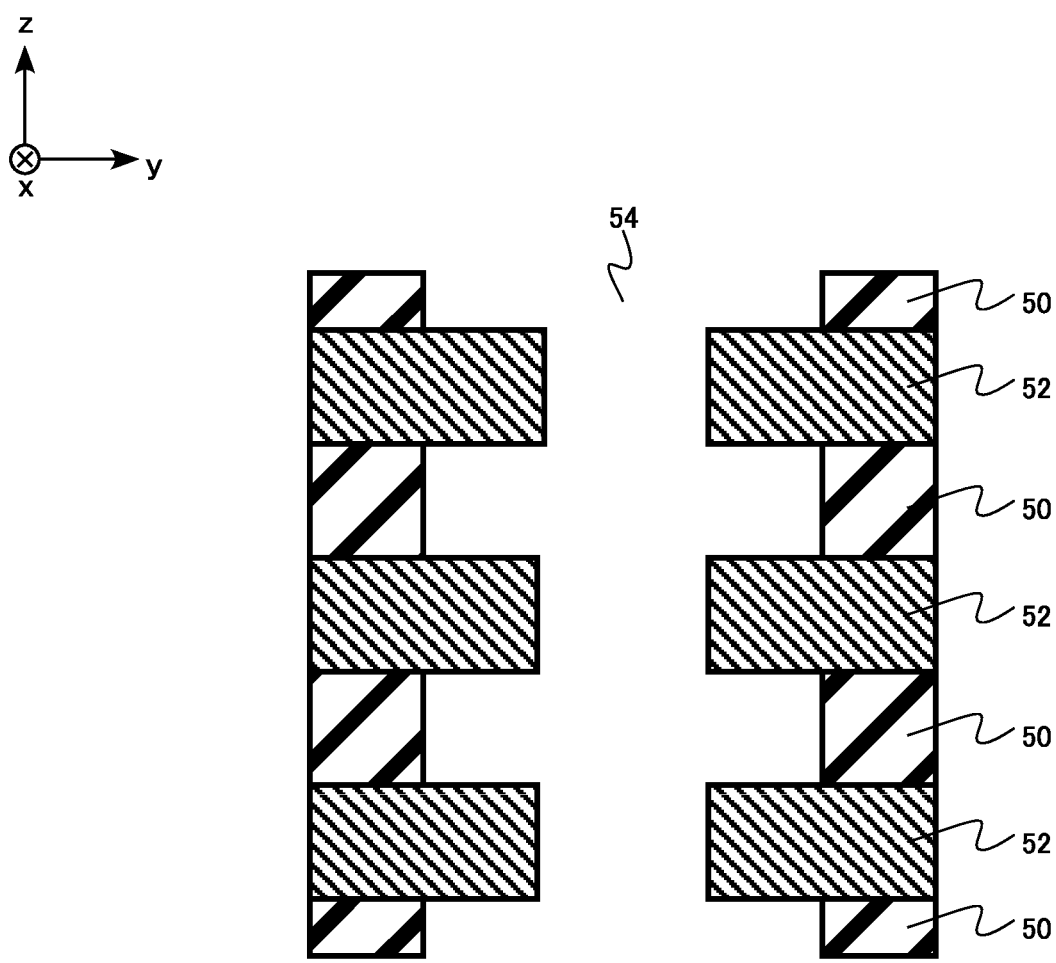
FIG. 6 is a schematic cross-sectional view showing the manufacturing method of the semiconductor memory device of the first embodiment.

Next, the silicon oxide layer 50 exposed on the inner surface of the opening 54 is selectively retracted by wet etching (FIG. 6). For wet etching, for example, a buffered hydrofluoric acid solution is used to perform selective etching the silicon oxide layer 50 with respect to the silicon nitride layer 52.

Figure 7:
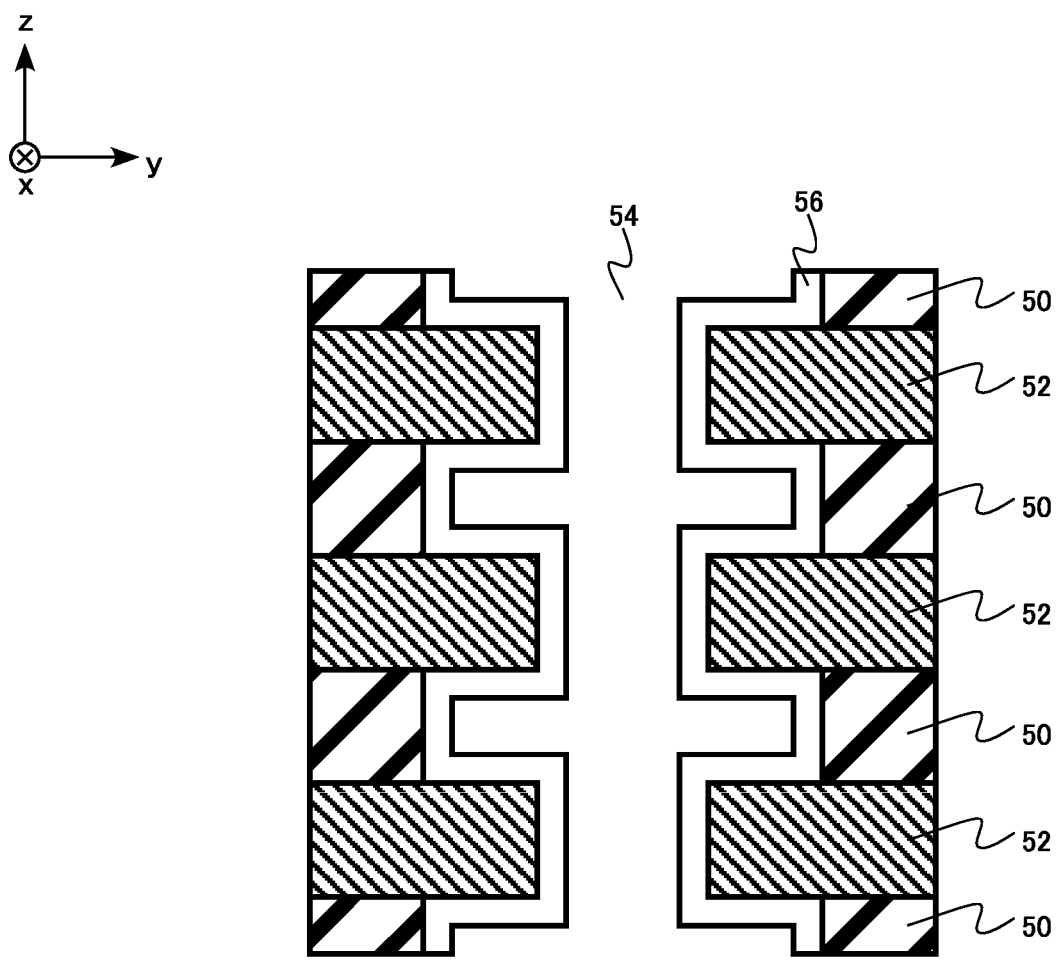
FIG. 7 is a schematic cross-sectional view showing the manufacturing method of the semiconductor memory device of the first embodiment.

Next, a hafnium oxide film 56 is formed in the opening 54 and in a region where the silicon oxide layer 50 has been retracted (FIG. 7). The hafnium oxide film 56 is formed by, for example, the atomic layer deposition method (ALD method). For example, as an additive element, silicon (Si) is added to the hafnium oxide film 56. A part of the hafnium oxide film 56 eventually becomes the gate insulating layer 12.

Next, a silicon oxide film 58 is formed in the opening 54 and in a region where the silicon oxide layer 50 has been retracted. The silicon oxide film 58 is formed by, for example, the CVD method.

Figure 8:
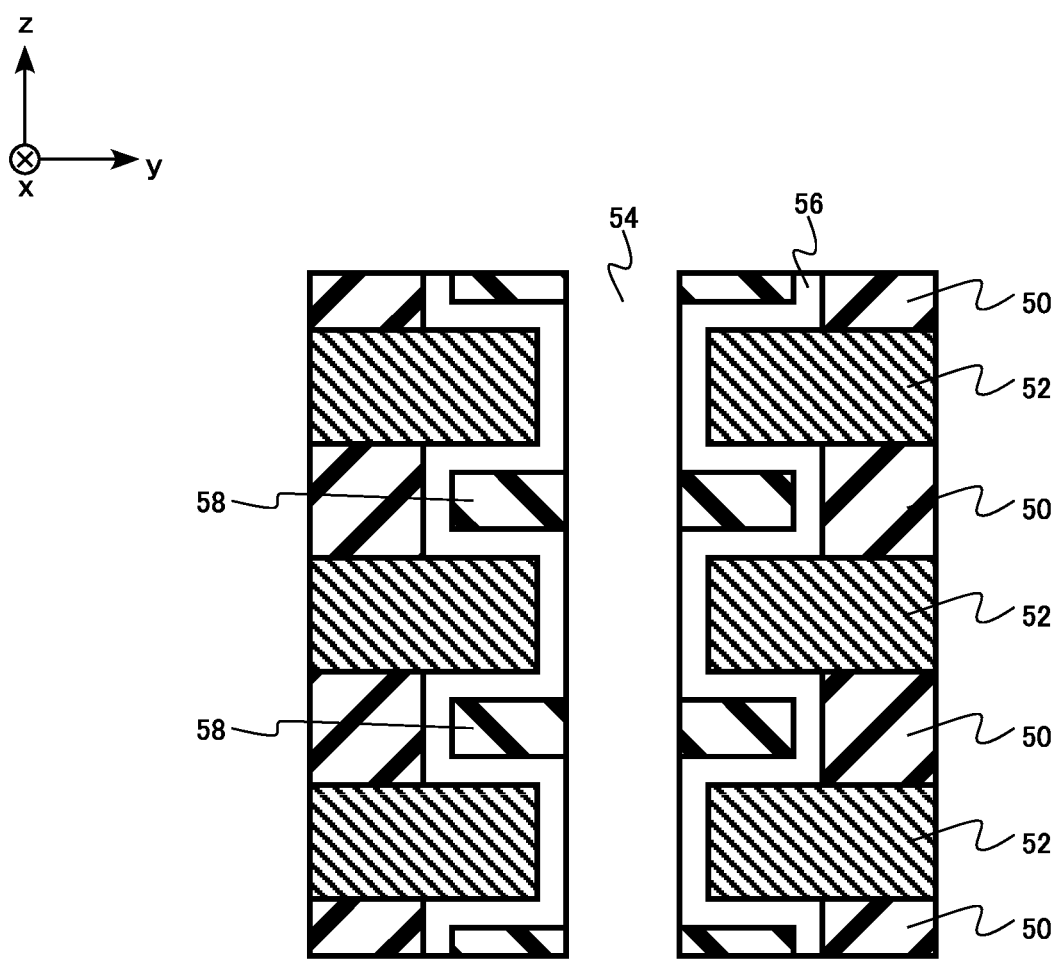
FIG. 8 is a schematic cross-sectional view showing the manufacturing method of the semiconductor memory device of the first embodiment.

Next, the silicon oxide film 58 on the inner surface of the opening 54 is removed by etching (FIG. 8). The silicon oxide film 58 is removed by etching with, for example, the RIE method. The silicon oxide film 58 remains on the hafnium oxide film 56 in the region where the silicon oxide layer 50 has been retracted. The silicon oxide film 58 eventually becomes the second interlayer insulating layer 18.

Next, a silicon oxide film 60 is formed on the inner surface of the opening 54. The silicon oxide film 60 is formed by, for example, the CVD method. The silicon oxide film 60 eventually becomes the interface insulating layer 14.

Figure 9:
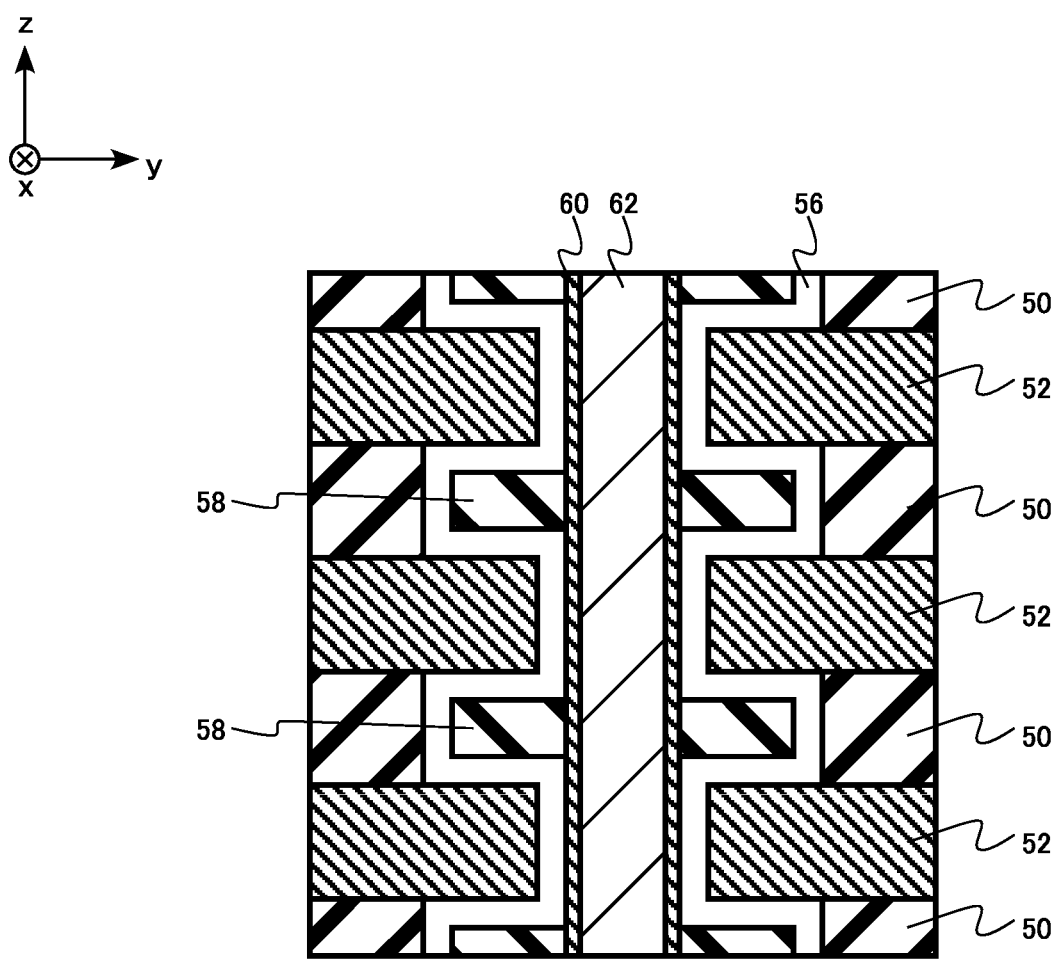
FIG. 9 is a schematic cross-sectional view showing the manufacturing method of the semiconductor memory device of the first embodiment.

Next, a polycrystalline silicon film 62 is formed in the opening 54 to fill the opening 54 (FIG. 9). The polycrystalline silicon film 62 is formed by, for example, the CVD method. The polycrystalline silicon film 62 eventually becomes the semiconductor layer 10.

Figure 10:
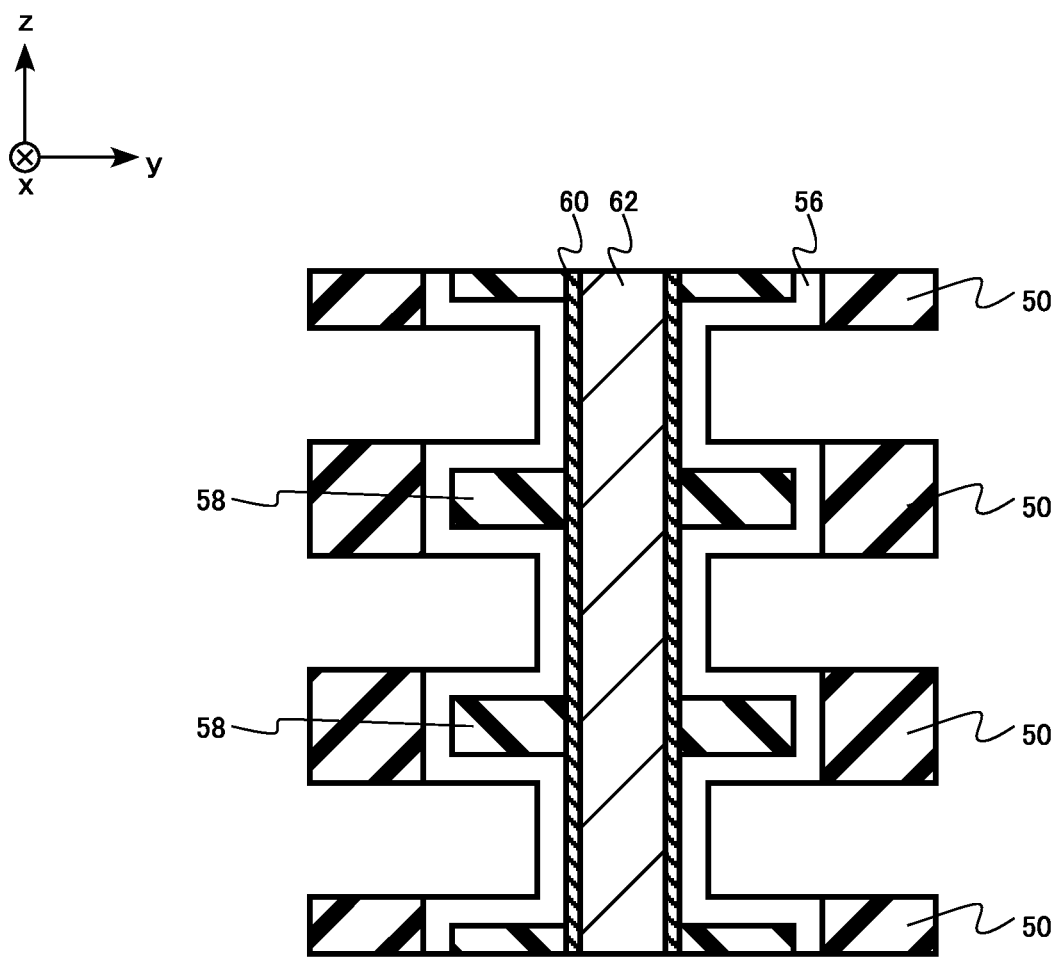
FIG. 10 is a schematic cross-sectional view showing the manufacturing method of the semiconductor memory device of the first embodiment.

Next, the silicon nitride layer 52 is selectively removed by wet etching using an etching groove not illustrated (FIG. 10). For wet etching, for example, a phosphoric acid solution is used to selectively etch the silicon nitride layer 52 with respect to the silicon oxide layer 50 and the hafnium oxide film 56.

Figure 11:
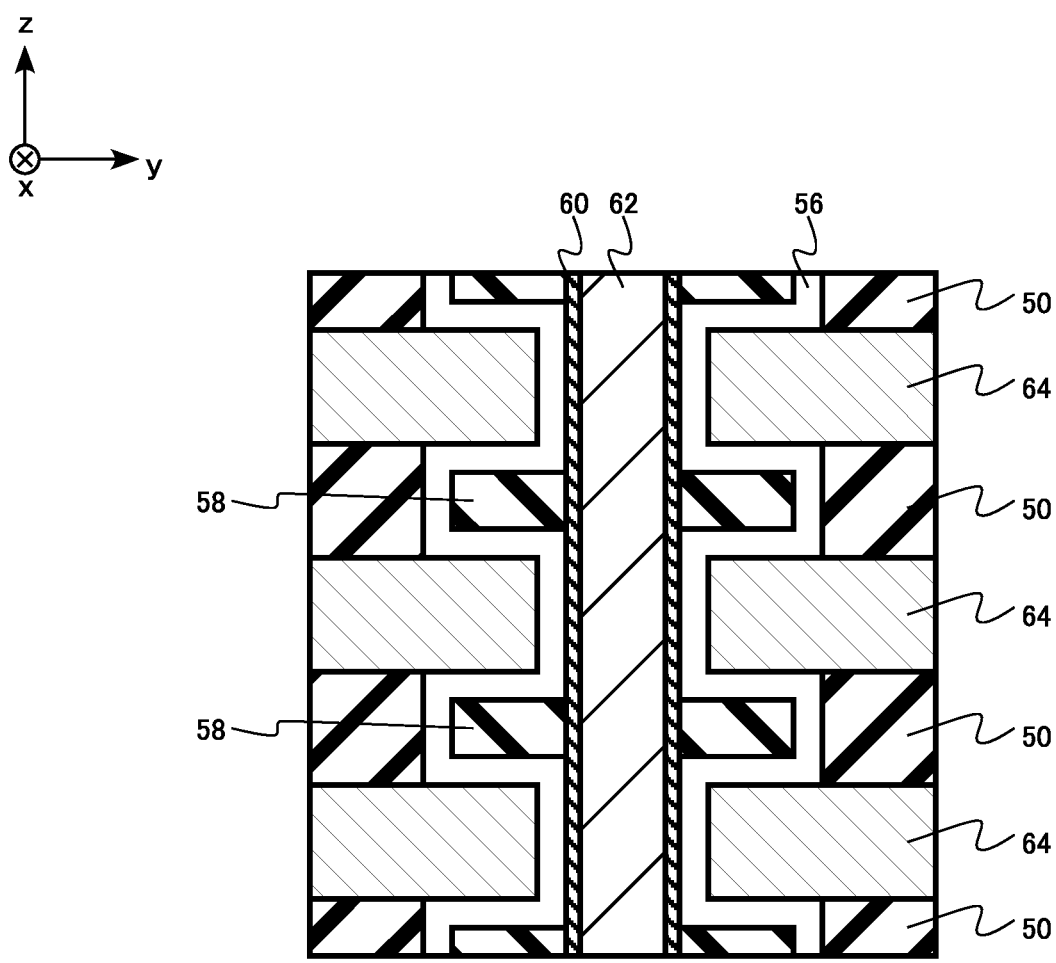
FIG. 11 is a schematic cross-sectional view showing the manufacturing method of the semiconductor memory device of the first embodiment.

Next, a tungsten film 64 is formed on the hafnium oxide film 56 (FIG. 11). The tungsten film 64 is formed by, for example, the CVD method. The tungsten film 64 eventually becomes the word line WL. For example, a titanium nitride film may be formed as a barrier metal film before the tungsten film 64.

After the tungsten film 64 is formed, crystallization annealing is performed. By crystallization annealing, the hafnium oxide film 56 becomes ferroelectric.

The semiconductor memory device of the first embodiment is manufactured by the above manufacturing method.

Next, the functions and effects of the semiconductor memory device of the first embodiment will be described.

Figure 12:
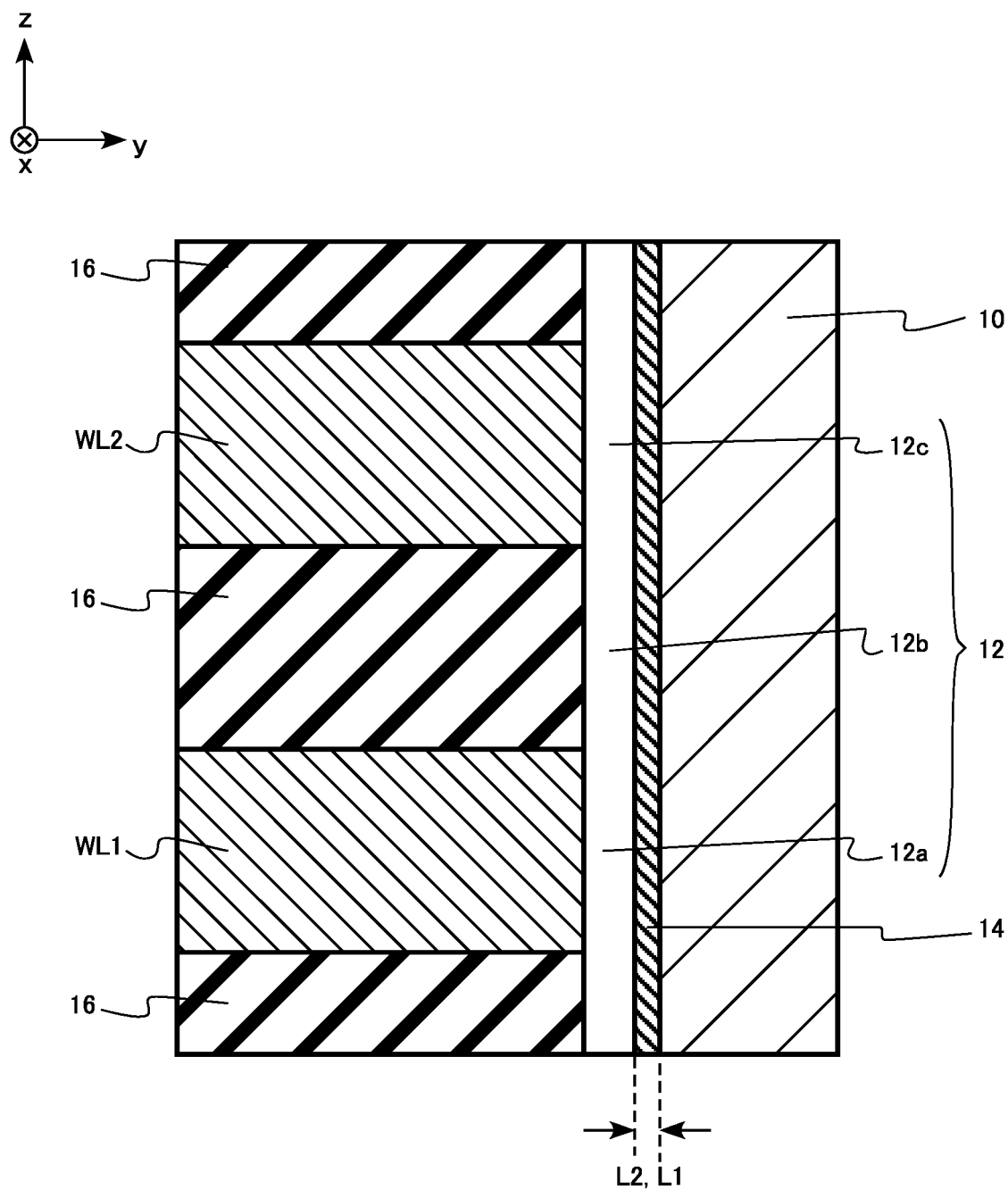
FIG. 12 is a schematic cross-sectional view of a memory cell of a semiconductor memory device of a comparative example.

FIG. 12 is a schematic cross-sectional view of the memory cell of the semiconductor memory device of the comparative example. FIG. 12 is a view corresponding to FIG. 3.

The memory cell of the semiconductor memory device of the comparative example is not provided with the second interlayer insulating layer 18 between the second region 12b of the gate insulating layer 12 and the interface insulating layer 14. Therefore, the distance (L1 in FIG. 12) between the second region 12b and the semiconductor layer 10 is equal to the distance (L2 in FIG. 12) between the first region 12a and the semiconductor layer 10. The second region 12b is in contact with the interface insulating layer 14.

The second region 12b, which is a ferroelectric, contains a plurality of crystal grains. Each of the crystal grains serves as a polarization domain. The polarization state of each of the crystal grains depends on the crystal orientation and the electric field direction of each of the crystal grains. The electrostatic potential of the surface of the semiconductor layer 10 facing the second region 12b depends on the polarization state of each of the crystal grains.

The carrier electrons flowing on the surface of the semiconductor layer 10 facing the second region 12b flow through a narrow portion of the electrostatic potential sandwiched between portions having a high electrostatic potential, for example. For example, when electrons are trapped at the interface between the second region 12b immediately above such a narrow portion and the interface insulating layer 14, scattering of carrier electrons by the trapped electrons increases. Therefore, the fluctuation of the current flowing through the semiconductor layer 10 between the first word line WL1 and the second word line WL2 increases.

As the electrons repeat trap and detrap, the current flowing through the semiconductor layer 10 between the first word line WL1 and the second word line WL2 becomes unstable. As the current flowing through the first word line WL1 and the second word line WL2 becomes unstable, the operation of the memory cell becomes unstable. For example, the current flowing through the memory string MS during the write operation and the read operation of the memory cell becomes unstable, and the operation of the memory cell becomes unstable.

In the memory cell of the semiconductor memory device of the first embodiment, the distance (L1 in FIG. 3) between the second region 12b and the semiconductor layer 10 is larger than the distance (L2 in FIG. 3) between the first region 12a and the semiconductor layer 10. Therefore, the second region 12b is separated from the semiconductor layer 10. Therefore, the influence of the polarization state of the crystal grain contained in the second region 12b on the electrostatic potential of the surface of the semiconductor layer 10 is reduced. Therefore, the current flowing through the semiconductor layer 10 between the first word line WL1 and the second word line WL2 is stabilized, and the operation of the memory cell is stabilized.

Figure 13:
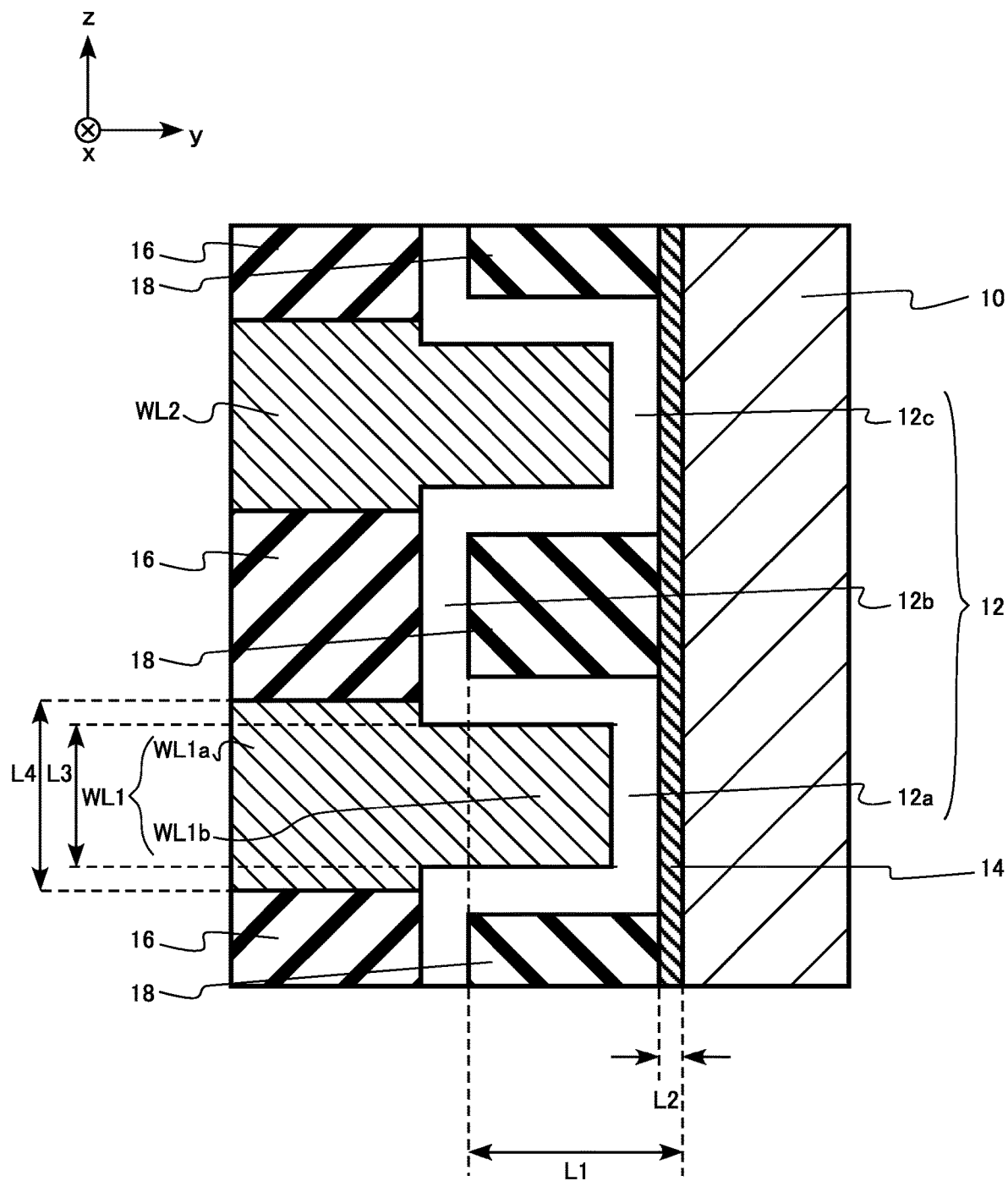
FIG. 13 is a schematic cross-sectional view of a memory cell of a modification of the semiconductor memory device of the first embodiment.

FIG. 13 is a schematic cross-sectional view of the memory cell of the modification of the semiconductor memory device of the first embodiment. The modification of the semiconductor memory device of the first embodiment is different from the semiconductor memory device of the first embodiment in that the first gate electrode layer includes a first portion and a second portion closer to the semiconductor layer than the first portion, and the length of the second portion in the first direction is shorter than the length of the first portion in the first direction.

The first word line WL1 includes a wide portion WL1a and a narrow portion WL1b. The wide portion WL1a is an example of the first portion. The narrow portion WL1b is an example of the second portion. The narrow portion WL1b is closer to the semiconductor layer 10 than the wide portion WL1a.

The length (L3 in FIG. 13) of the narrow portion WL1b in the z direction is shorter than the length (L4 in FIG. 13) of the wide portion WL1a in the z direction.

According to the memory cell of the modification, the interval between the first word line WL1 and the second word line WL2 can be widened on the side close to the semiconductor layer 10. Therefore, it becomes easy to form the second interlayer insulating layer 18 filling between the first word line WL1 and the second word line WL2. It is possible to suppress interference between the first word line WL1 and the second word line WL2 during the write operation or the read operation.

As described above, according to the semiconductor memory device and the modification of the first embodiment, the current flowing through the semiconductor layer between the word line WL and the word line WL is stabilized, and the stable operation of the memory cell can be performed. Therefore, it is possible to achieve a stably operating semiconductor memory device.

Second Embodiment

The semiconductor memory device of the second embodiment is different from the semiconductor memory device of the first embodiment in that the thickness of the second region is thinner than the thickness of the first region. Hereinafter, part of description of the contents overlapping the first embodiment may be omitted.

Figure 14:
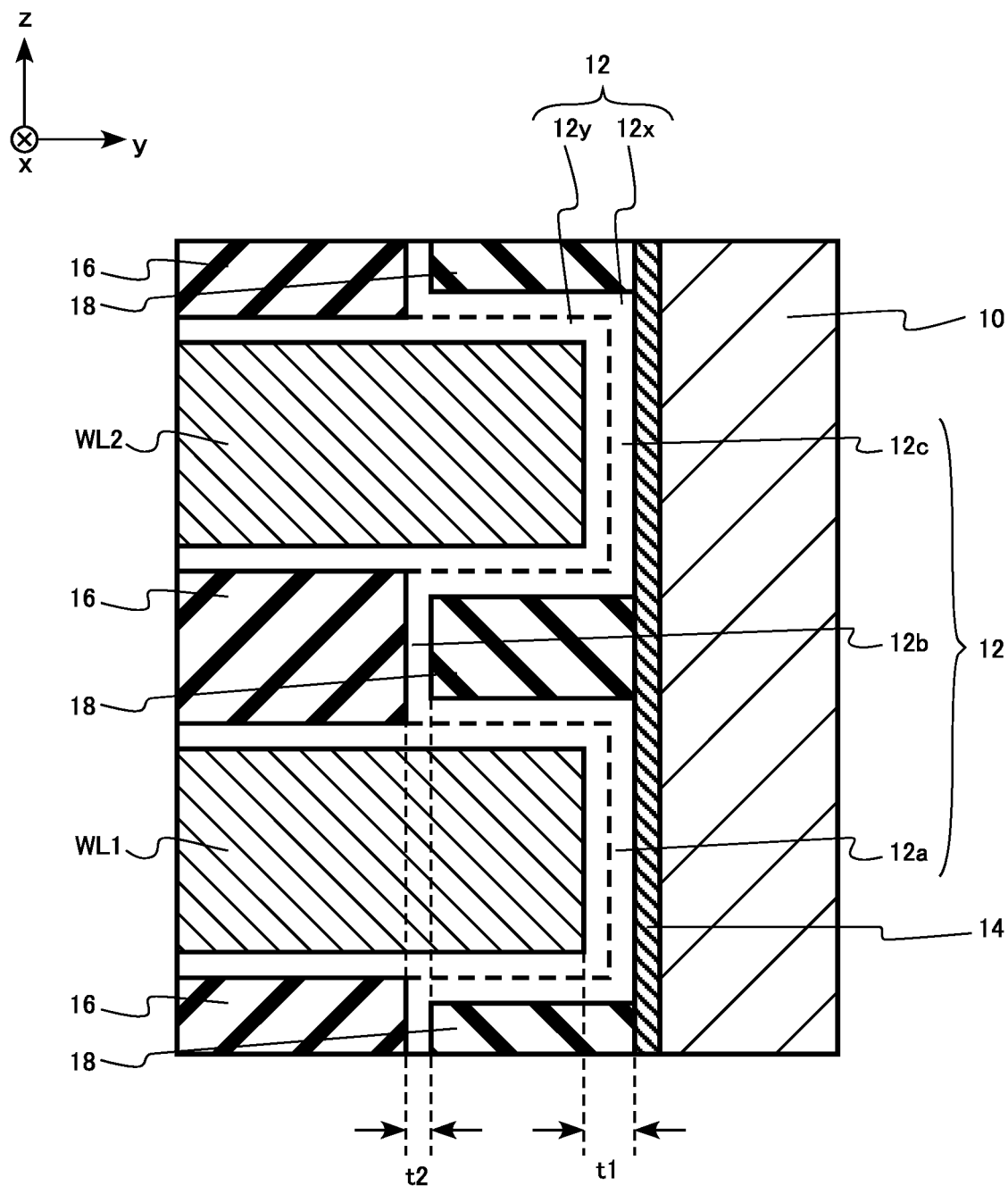
FIG. 14 is a schematic cross-sectional view of a memory cell of a semiconductor memory device of a second embodiment.

FIG. 14 is a schematic cross-sectional view of the memory cell of the semiconductor memory device of the second embodiment. FIG. 14 is an enlarged cross-sectional view of a part of two memory cells.

As shown in FIG. 14, the two memory cells of the semiconductor memory device of the second embodiment include the first word line WL1, the second word line WL2, the semiconductor layer 10, the gate insulating layer 12, the interface insulating layer 14, the first interlayer insulating layer 16, and the second interlayer insulating layer 18. The gate insulating layer 12 includes a first region 12a, a second region 12b, and a third region 12c.

The interface insulating layer 14 is an example of the first insulating layer. The second interlayer insulating layer 18 is an example of the second insulating layer. The first word line WL1 is an example of the first gate electrode layer. The second word line WL2 is an example of the second gate electrode layer.

The gate insulating layer 12 includes a first layer 12x and a second layer 12y. The first layer 12x is provided between the second layer 12y and the semiconductor layer 10.

The first region 12a and the third region 12c of the gate insulating layer 12 include the first layer 12x and the second layer 12y. The second region 12b of the gate insulating layer 12 includes the second layer 12y. The second region 12b of the gate insulating layer 12 does not include the first layer 12x.

The thickness of the second region 12b in the y direction (t2 in FIG. 14) is thinner than the thickness of the first region 12a in the y direction (t1 in FIG. 14).

When the memory cell of the semiconductor memory device of the second embodiment is manufactured, for example, the formation of the first layer 12x and the formation of the second layer 12y are performed in separate processes.

For example, when a hafnium oxide film is crystallized by crystallization annealing, if the film thickness of the hafnium oxide film is thin, the hafnium oxide film is less likely to become ferroelectric. In other words, if the film thickness of the hafnium oxide film is thin, the crystal of the orthorhombic crystal system or the trigonal crystal system is less likely to be formed.

Therefore, by reducing the thickness of the second region 12b, the second region 12b is less likely to become ferroelectric, and the ferroelectricity of the second region 12b becomes weaker than that of the first region 12a. Therefore, the influence of the polarization state of the crystal grain contained in the second region 12b on the electrostatic potential of the surface of the semiconductor layer 10 is further reduced. Therefore, the current flowing through the semiconductor layer 10 between the first word line WL1 and the second word line WL2 is further stabilized, and the operation of the memory cell is stabilized.

The second region 12b has a crystal other than the crystal of the orthorhombic crystal system and the trigonal crystal system as a main constituent substance. A main constituent substance of the second region 12b is other than a crystal of an orthorhombic crystal system and a trigonal crystal system. Having a crystal other than the crystal of the orthorhombic crystal system and the trigonal crystal system as a main constituent substance means that a substance other than a crystal of the orthorhombic crystal system or the trigonal crystal system exhibits the highest abundance ratio among the substances constituting the second region 12b.

In the second region 12b, for example, the abundance ratio of a crystal other than the crystal of the orthorhombic crystal system and the trigonal crystal system or the amorphous phase is larger than the abundance ratio of the crystal of the orthorhombic crystal system or the trigonal crystal system. The second region 12b is, for example, crystalline or amorphous.

The second region 12b may be paraelectric.

Figure 15:
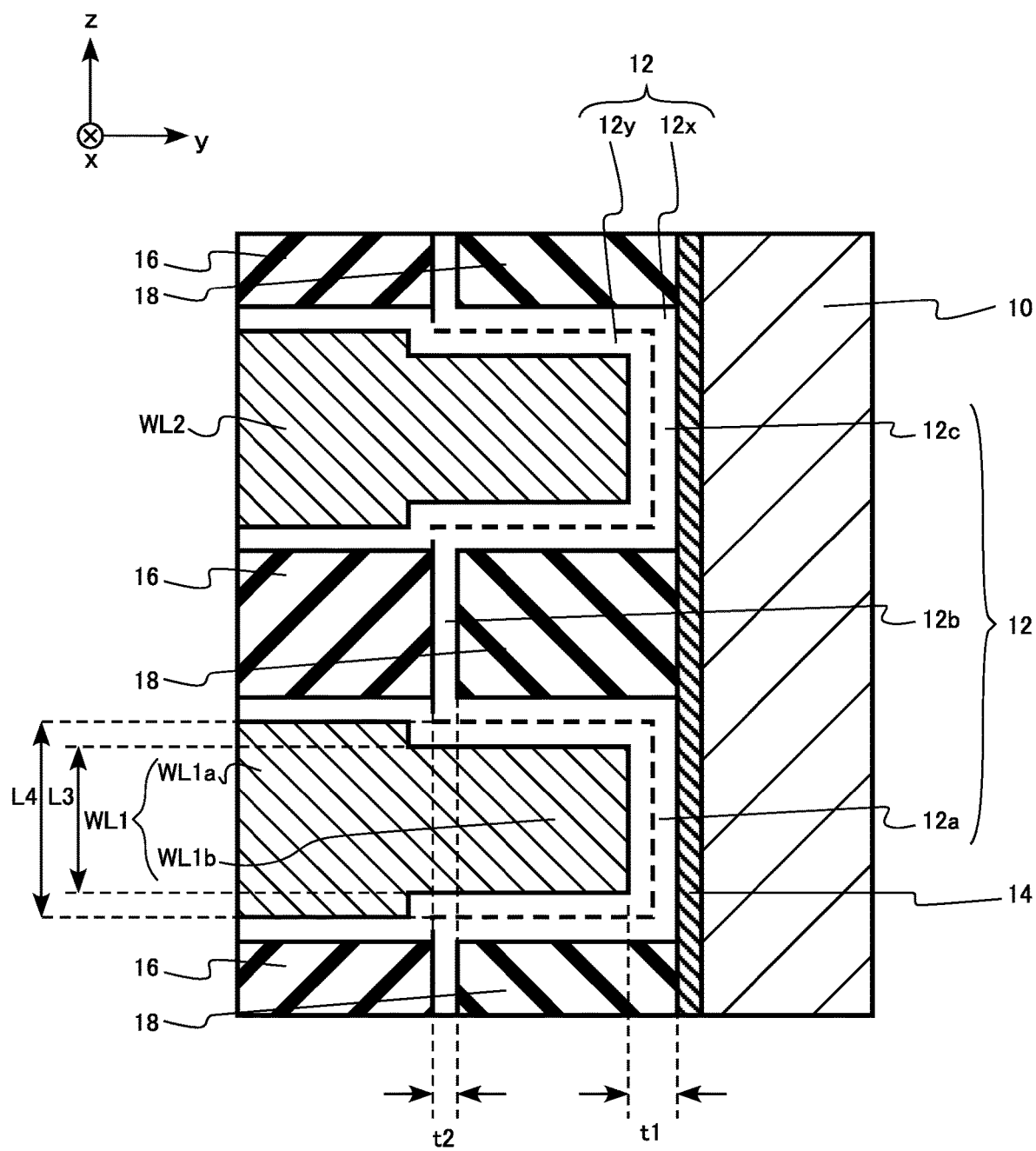
FIG. 15 is a schematic cross-sectional view of a memory cell of a modification of the semiconductor memory device of the second embodiment.

FIG. 15 is a schematic cross-sectional view of the memory cell of the modification of the semiconductor memory device of the second embodiment. The modification of the semiconductor memory device of the second embodiment is different from the semiconductor memory device of the second embodiment in that the first gate electrode layer includes a first portion and a second portion closer to the semiconductor layer than the first portion, and the length of the second portion in the first direction is shorter than the length of the first portion in the first direction.

The first word line WL1 includes a wide portion WL1a and a narrow portion WL1b. The wide portion WL1a is an example of the first portion. The narrow portion WL1b is an example of the second portion. The narrow portion WL1b is closer to the semiconductor layer 10 than the wide portion WL1a.

The length (L3 in FIG. 15) of the narrow portion WL1b in the z direction is shorter than the length (L4 in FIG. 15) of the wide portion WL1a in the z direction.

According to the memory cell of the modification, the interval between the first word line WL1 and the second word line WL2 can be widened on the side close to the semiconductor layer 10. Therefore, it becomes easy to form the second interlayer insulating layer 18 filling between the first word line WL1 and the second word line WL2.

As described above, according to the semiconductor memory device and the modification of the second embodiment, the current flowing through the semiconductor layer between the word line WL and the word line WL is stabilized, and the stable operation of the memory cell can be performed. Therefore, it is possible to achieve a stably operating semiconductor memory device.

Third Embodiment

The semiconductor memory device of the third embodiment is different from the semiconductor memory device of the first embodiment in that the semiconductor memory device of the third embodiment further including a conductive layer provided between the first region and the first insulating layer. Hereinafter, part of description of the contents overlapping the first embodiment may be omitted.

The semiconductor memory device of the third embodiment is a three-dimensional NAND flash memory having a memory cell of the metal ferroelectrics metal insulator semiconductor structure (MFMIS structure).

Figure 16:
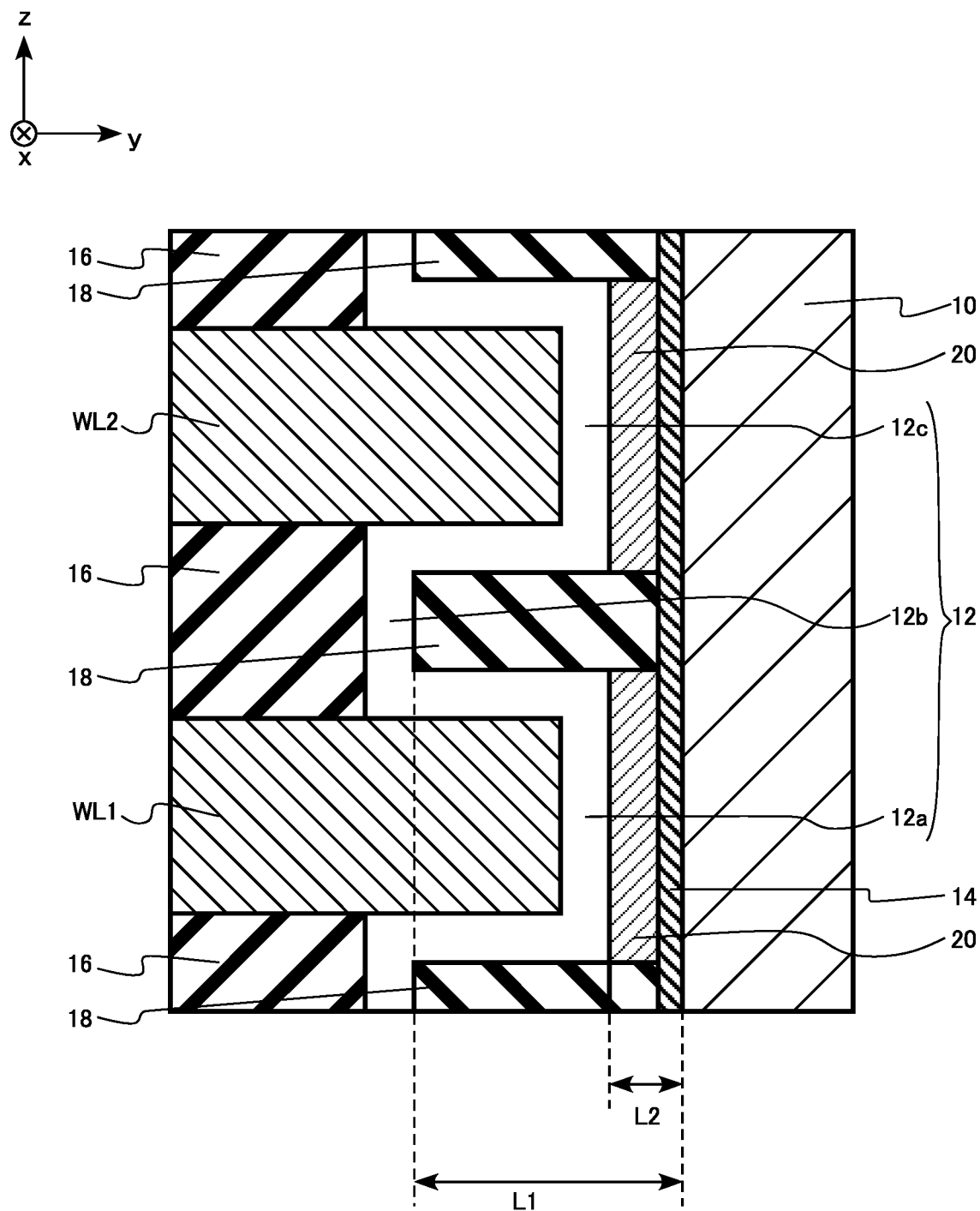
FIG. 16 is a schematic cross-sectional view of a memory cell of a semiconductor memory device of a third embodiment.

FIG. 16 is a schematic cross-sectional view of the memory cell of the semiconductor memory device of the third embodiment. FIG. 16 is an enlarged cross-sectional view of a part of two memory cells.

Figure 17:
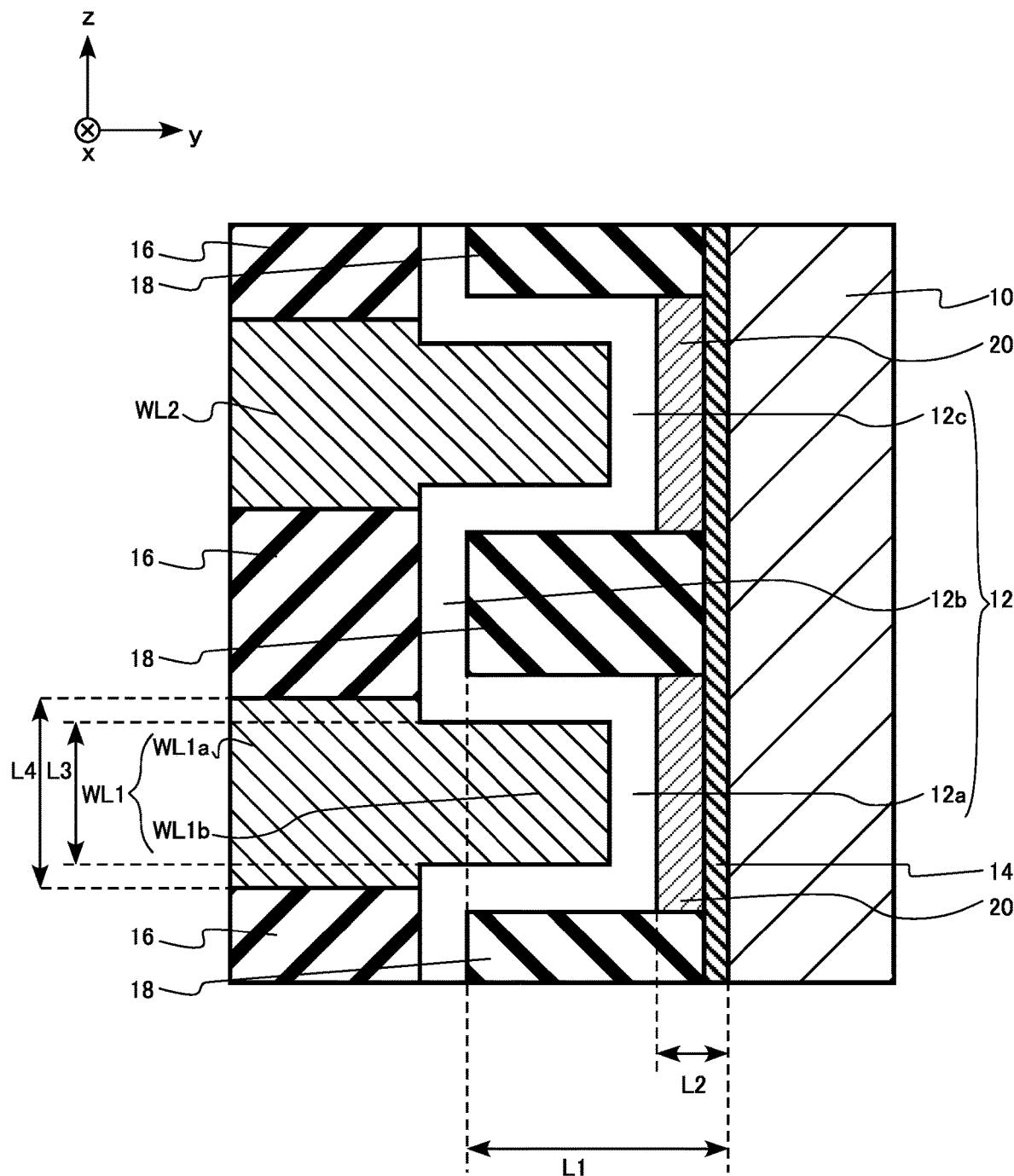
FIG. 17 is a schematic cross-sectional view of a memory cell of a modification of the semiconductor memory device of the third embodiment.

As shown in FIG. 17, the two memory cells include the first word line WL1, the second word line WL2, the semiconductor layer 10, the gate insulating layer 12, the interface insulating layer 14, the first interlayer insulating layer 16, the second interlayer insulating layer 18, and a conductive layer 20. The gate insulating layer 12 includes a first region 12a, a second region 12b, and a third region 12c.

The interface insulating layer 14 is an example of the first insulating layer. The second interlayer insulating layer 18 is an example of the second insulating layer. The first word line WL1 is an example of the first gate electrode layer. The second word line WL2 is an example of the second gate electrode layer.

The conductive layer 20 is provided between the first region 12a and the interface insulating layer 14. The conductive layer 20 is provided between the third region 12c and the interface insulating layer 14.

The conductive layer 20 comes into contact with, for example, the first region 12a and the third region 12c. The conductive layer 20 comes into contact with, for example, the interface insulating layer 14.

The conductive layer 20 is a conductor. The conductive layer 20 is, for example, a metal, a metal nitride, or a metal oxide. The conductive layer 20 is, for example, titanium, titanium nitride, titanium oxide, tantalum, tantalum nitride, tantalum oxide, tungsten, tungsten nitride, or tungsten oxide.

The thickness of the conductive layer 20 in the y direction is larger than the thickness of the interface insulating layer 14 in the y direction, for example.

The distance (L1 in FIG. 16) between the second region 12b and the semiconductor layer 10 is larger than the distance (L2 in FIG. 16) between the first region 12a and the semiconductor layer 10. The distance (L1 in FIG. 16) between the second region 12b and the semiconductor layer 10 is larger than the distance between the first word line WL1 and the semiconductor layer 10.

Next, the functions and effects of the semiconductor memory device of the third embodiment will be described.

The first region 12a, which is a ferroelectric, contains a plurality of crystal grains. Each of the crystal grains serves as a polarization domain. The polarization state of each of the crystal grains depends on the crystal orientation and the electric field direction of each of the crystal grains. The electrostatic potential of the surface of the semiconductor layer 10 facing the first region 12a depends on the polarization state of each of the crystal grains. In other words, the threshold voltage controlled by the first word line WL1 is locally different depending on the portion where each of the crystal grains faces.

When the memory cell is scaled-down, the contribution of the polarization state of one crystal grain to the threshold voltage of the memory cell transistor MT increases. Therefore, when the memory cell is scaled-down, the variation in the threshold voltage of the memory cell transistor MT increases.

Furthermore, for example, a case where the polarization state of one crystal grain in the first region 12a is inverted by the electrical stress applied to the memory cell will be considered. Since the contribution of the polarization state of one crystal grain to the threshold voltage of the memory cell transistor MT is large, the fluctuation of the threshold voltage of the memory cell transistor MT due to the inversion of the polarization state becomes large. Therefore, there is a risk that for example, data stored in the memory cell is destroyed.

The semiconductor memory device of the third embodiment is provided with the conductive layer 20 between the first region 12a and the interface insulating layer 14. Since the conductive layer 20 is a conductor, the surface of the conductive layer 20 on the side facing the interface insulating layer 14 becomes an equipotential surface. Therefore, even if there is a variation in the polarization state in the crystal grain included in the first region 12a, the variation in the polarization state is averaged by providing the conductive layer 20. Therefore, the contribution of the polarization state of one crystal grain to the threshold voltage of the memory cell transistor MT becomes small. Therefore, the variation in the threshold voltage of the memory cell transistor MT is suppressed.

Since the contribution of the polarization state of one crystal grain to the threshold voltage of the memory cell transistor MT becomes small, the fluctuation of the threshold voltage of the memory cell transistor MT due to the inversion of the polarization state is also suppressed.

In the semiconductor memory device of the third embodiment, the distance (L1 in FIG. 16) between the second region 12b and the semiconductor layer 10 is larger than the distance (L2 in FIG. 16) between the first region 12a and the semiconductor layer 10. Therefore, similarly to the semiconductor memory device of the first embodiment, the current flowing through the semiconductor layer between the word line WL and the word line WL is stabilized, and the stable operation of the memory cell can be performed.

FIG. 17 is a schematic cross-sectional view of the memory cell of the modification of the semiconductor memory device of the third embodiment. The modification of the semiconductor memory device of the third embodiment is different from the semiconductor memory device of the third embodiment in that the first gate electrode layer includes a first portion and a second portion closer to the semiconductor layer than the first portion, and the length of the second portion in the first direction is shorter than the length of the first portion in the first direction.

The first word line WL1 includes a wide portion WL1a and a narrow portion WL1b. The wide portion WL1a is an example of the first portion. The narrow portion WL1b is an example of the second portion. The narrow portion WL1b is closer to the semiconductor layer 10 than the wide portion WL1a.

The length (L3 in FIG. 17) of the narrow portion WL1b in the z direction is shorter than the length (L4 in FIG. 17) of the wide portion WL1a in the z direction.

According to the memory cell of the modification, the interval between the first word line WL1 and the second word line WL2 can be widened on the side close to the semiconductor layer 10. Therefore, it becomes easy to form the second interlayer insulating layer 18 filling between the first word line WL1 and the second word line WL2.

As described above, according to the semiconductor memory device and the modification of the third embodiment, the current flowing through the semiconductor layer between the word line WL and the word line WL is stabilized, and the stable operation of the memory cell can be performed. By providing the conductive layer, variation and fluctuation in the threshold voltage of the memory cell transistor are suppressed. Therefore, it is possible to achieve a stably operating semiconductor memory device.

Fourth Embodiment

A semiconductor memory device of the fourth embodiment includes: a semiconductor layer extending in a first direction; a gate electrode layer; a gate insulating layer provided between the gate electrode layer and the semiconductor layer, containing at least one metal element of hafnium (Hf) and zirconium (Zr) and oxygen (O), and having a crystal of an orthorhombic crystal system or a trigonal crystal system as a main constituent substance; an insulating layer provided between the gate insulating layer and the semiconductor layer; and a conductive layer provided between the gate insulating layer and the insulating layer, the conductive layer including a first portion facing the gate electrode layer in the first direction with the gate insulating layer interposed therebetween. The semiconductor memory device of the fourth embodiment is different from the semiconductor memory device of the third embodiment in that the conductive layer includes a first portion facing the gate electrode layer in the first direction with the gate insulating layer interposed therebetween. Hereinafter, part of description of the contents overlapping the third embodiment may be omitted.

The semiconductor memory device of the fourth embodiment is a three-dimensional NAND flash memory having a memory cell of the MFMIS structure.

Figure 18:
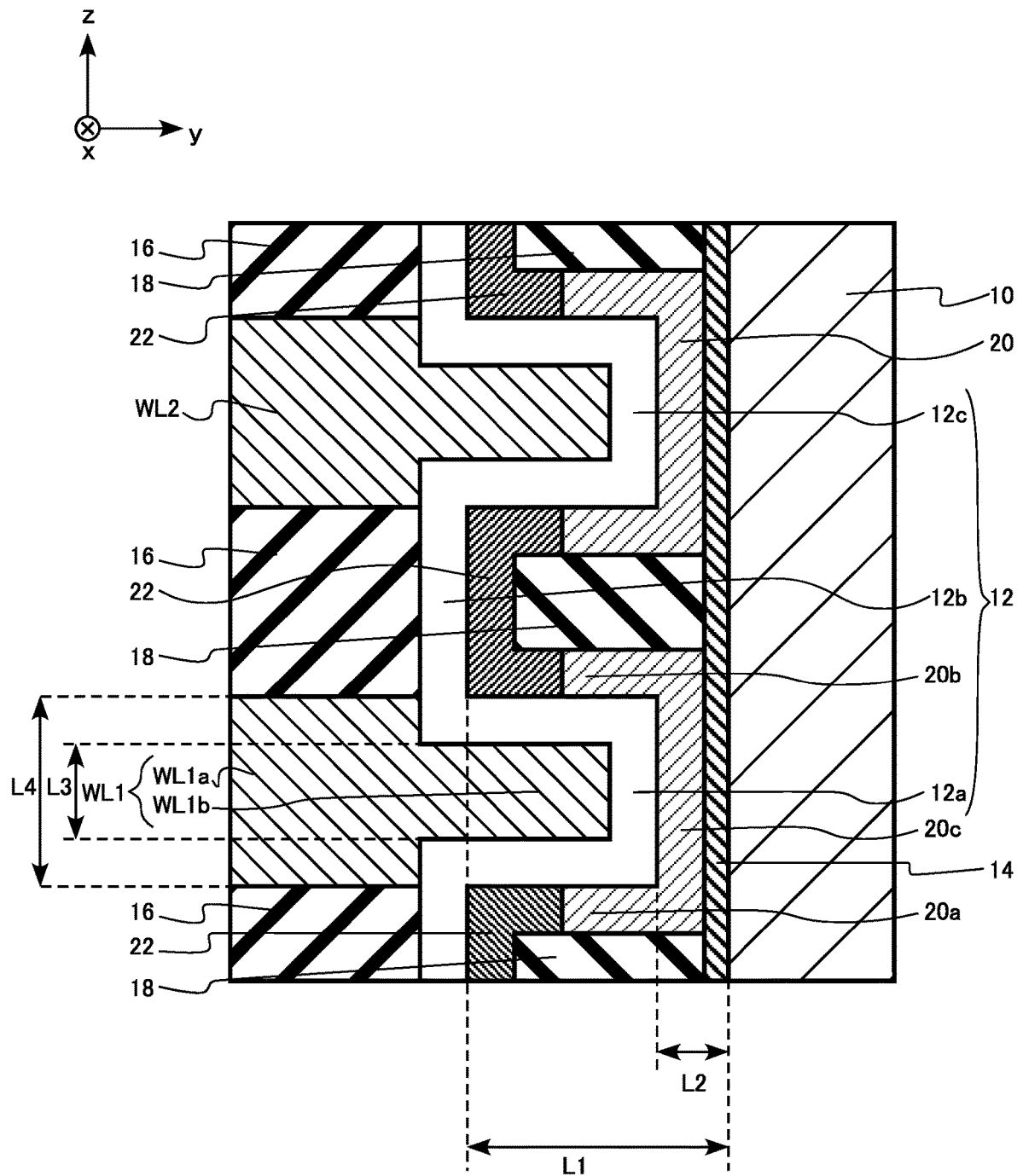
FIG. 18 is a schematic cross-sectional view of a memory cell of a semiconductor memory device of a fourth embodiment.

FIG. 18 is a schematic cross-sectional view of the memory cell of the semiconductor memory device of the fourth embodiment. FIG. 18 is an enlarged cross-sectional view of a part of a memory cell.

As shown in FIG. 18, the memory cell includes the first word line WL1, the second word line WL2, the semiconductor layer 10, the gate insulating layer 12, the Interface insulating layer 14, the first interlayer insulating layer 16, the second interlayer insulating layer 18, the conductive layer 20, and an intermediate insulating layer 22. The gate insulating layer 12 includes a first region 12a, a second region 12b, and a third region 12c.

The interface insulating layer 14 is an example of the insulating layer. The first word line WL1 is an example of the gate electrode layer.

The conductive layer 20 is provided between the gate insulating layer 12 and the interface insulating layer 14. The conductive layer 20 is provided between the first region 12a and the interface insulating layer 14. The conductive layer 20 is provided between the third region 12c and the interface insulating layer 14. The conductive layer 20 faces the first word line WL1 in the y direction with the gate insulating layer 12 interposed therebetween.

The conductive layer 20 comes into contact with, for example, the first region 12a and the third region 12c. The conductive layer 20 comes into contact with, for example, the interface insulating layer 14.

The conductive layer 20 includes a first end 20a, a second end 20b, and a center portion 20c. The first end 20a is an example of the first portion. The center portion 20c is an example of the second portion. The second end 20b is an example of the third portion.

The first end 20a is provided between the gate insulating layer 12 and the second interlayer insulating layer 18. The second end 20b is provided between the gate insulating layer 12 and the second interlayer insulating layer 18. The second end 20b is disposed in the z direction of the first end 20a. The center portion 20c is provided between the first region 12a and the interface insulating layer 14. The center portion 20c is provided between the first end 20a and the second end 20b. The center portion 20c faces the first word line WL1 in the y direction with the gate insulating layer 12 interposed therebetween.

The conductive layer 20 faces the first word line WL1 in the z direction with the gate insulating layer 12 interposed therebetween. The first end 20a faces the first word line WL1 in the z direction with the gate insulating layer 12 interposed therebetween. The second end 20b faces the first word line WL1 in the z direction with the gate insulating layer 12 interposed therebetween. The first word line WL1 is provided between the first end 20a and the second end 20b.

The conductive layer 20 is a conductor. The conductive layer 20 is, for example, a metal, a metal nitride, or a metal oxide. The conductive layer 20 is, for example, titanium, titanium nitride, titanium oxide, tantalum, tantalum nitride, tantalum oxide, tungsten, tungsten nitride, or tungsten oxide.

The thickness of the conductive layer 20 in the y direction is larger than the thickness of the interface insulating layer 14 in the y direction, for example.

The intermediate insulating layer 22 is provided between the second region 12b of the gate insulating layer 12 and the second interlayer insulating layer 18. The intermediate insulating layer 22 is provided between the second region 12b of the gate insulating layer 12 and the conductive layer 20.

The material of the intermediate insulating layer 22 is different from the material of the gate insulating layer 12. The material of the intermediate insulating layer 22 is different from the material of the second interlayer insulating layer 18. The intermediate insulating layer 22 is, for example, an oxide, an oxynitride, or a nitride. The second interlayer insulating layer 18 is, for example, silicon nitride.

The first word line WL1 includes a wide portion WL1a and a narrow portion WL1b. The wide portion WL1a is an example of a sixth portion. The narrow portion WL1b is an example of a seventh portion. The narrow portion WL1b is closer to the semiconductor layer 10 than the wide portion WL1a.

The length (L3 in FIG. 18) of the narrow portion WL1b in the z direction is shorter than the length (L4 in FIG. 18) of the wide portion WL1a in the z direction.

The distance (L1 in FIG. 18) between the second region 12b and the semiconductor layer 10 is larger than the distance (L2 in FIG. 18) between the first region 12a and the semiconductor layer 10. The distance (L1 in FIG. 18) between the second region 12b and the semiconductor layer 10 is larger than the distance between the first word line WL1 and the semiconductor layer 10.

Next, an example of the manufacturing method of the semiconductor memory device of the fourth embodiment will be described. FIGS. 19 to 27 are schematic cross-sectional views showing the manufacturing method of the semiconductor memory device of the fourth embodiment.

First, a silicon oxide layer 50 and a silicon nitride layer 52 are alternately stacked on a semiconductor substrate not illustrated. The silicon oxide layer 50 and the silicon nitride layer 52 form the stack body 30. The silicon oxide layer 50 and the silicon nitride layer 52 are formed by, for example, the CVD method. A part of the silicon oxide layer 50 eventually becomes the first interlayer insulating layer 16.

Figure 19:
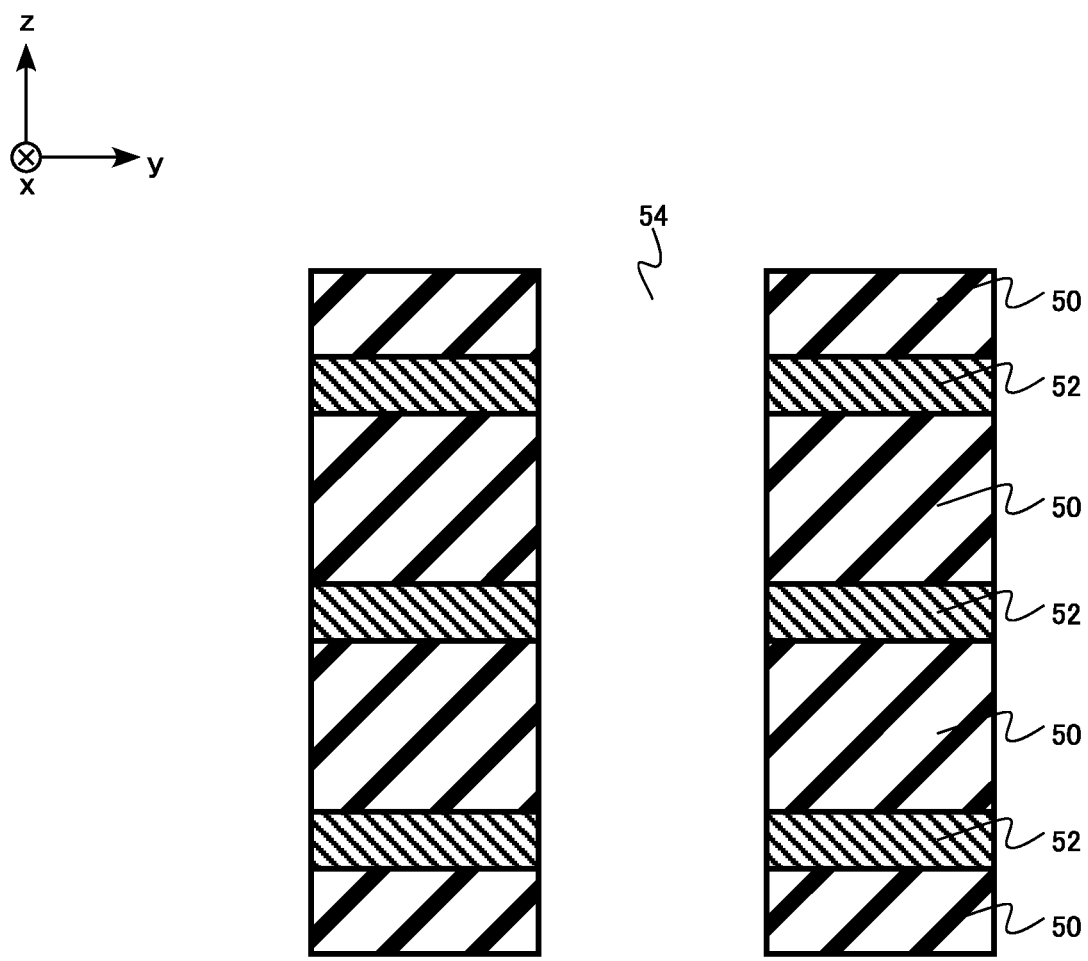
FIG. 19 is a schematic cross-sectional view showing a manufacturing method of the semiconductor memory device of the fourth embodiment.

Next, the opening 54 is formed in the silicon oxide layer 50 and the silicon nitride layer 52 (FIG. 19). The opening 54 is formed by, for example, the lithography method and the RIE method.

Figure 20:
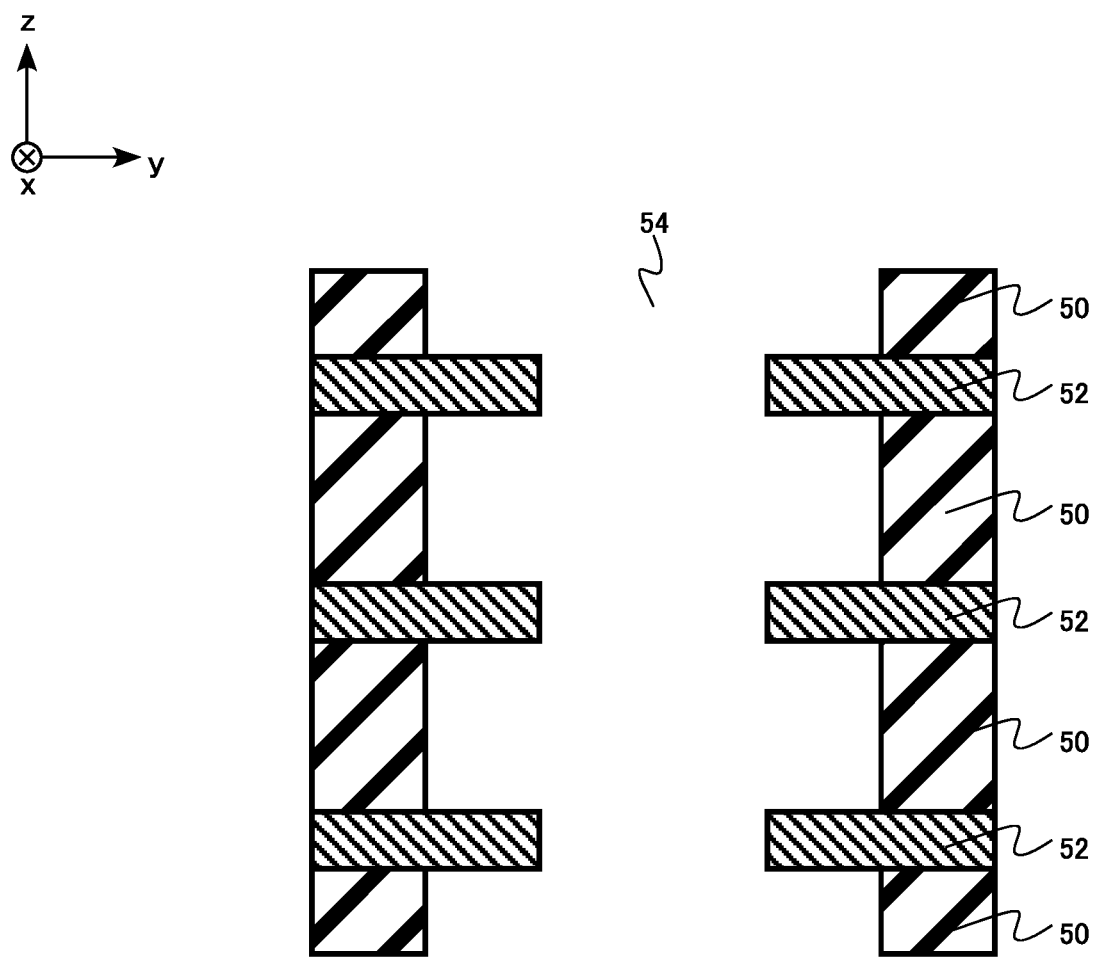
FIG. 20 is a schematic cross-sectional view showing the manufacturing method of the semiconductor memory device of the fourth embodiment.

Next, the silicon oxide layer 50 exposed on the inner surface of the opening 54 is selectively retracted by wet etching (FIG. 20). For wet etching, for example, a buffered hydrofluoric acid solution is used to perform selective etching the silicon oxide layer 50 with respect to the silicon nitride layer 52.

Figure 21:
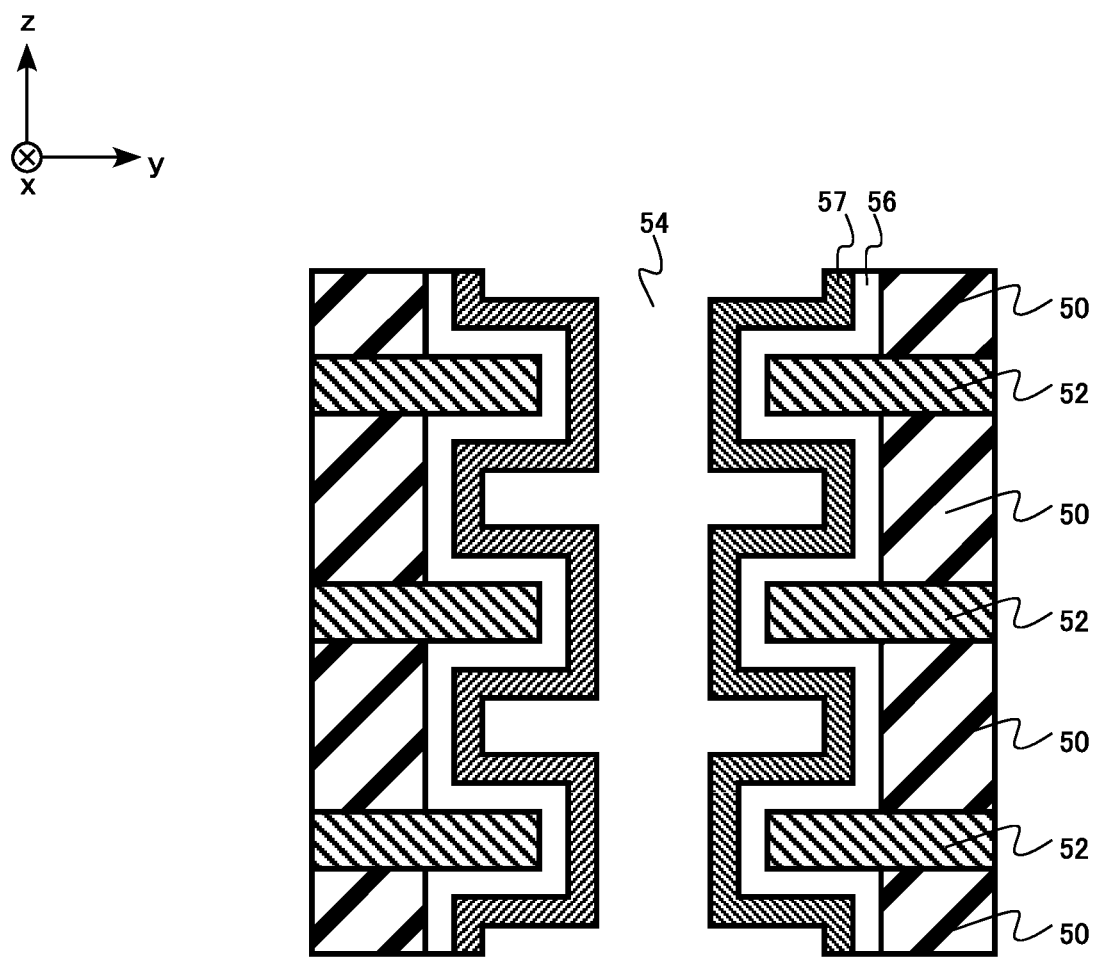
FIG. 21 is a schematic cross-sectional view showing the manufacturing method of the semiconductor memory device of the fourth embodiment.

Next, the hafnium oxide film 56 and the silicon nitride film 57 are formed in the opening 54 and in a region where the silicon oxide layer 50 has been retracted (FIG. 21). The hafnium oxide film 56 is formed by, for example, the ALD method. For example, as an additive element, silicon (Si) is added to the hafnium oxide film 56. A part of the hafnium oxide film 56 eventually becomes the gate insulating layer 12. The silicon nitride film 57 is formed by, for example, the CVD method. The silicon nitride film 57 eventually becomes the intermediate insulating layer 22.

Next, a silicon oxide film 58 is formed in the opening 54 and in a region where the silicon oxide layer 50 has been retracted. The silicon oxide film 58 is formed by, for example, the CVD method.

Figure 22:
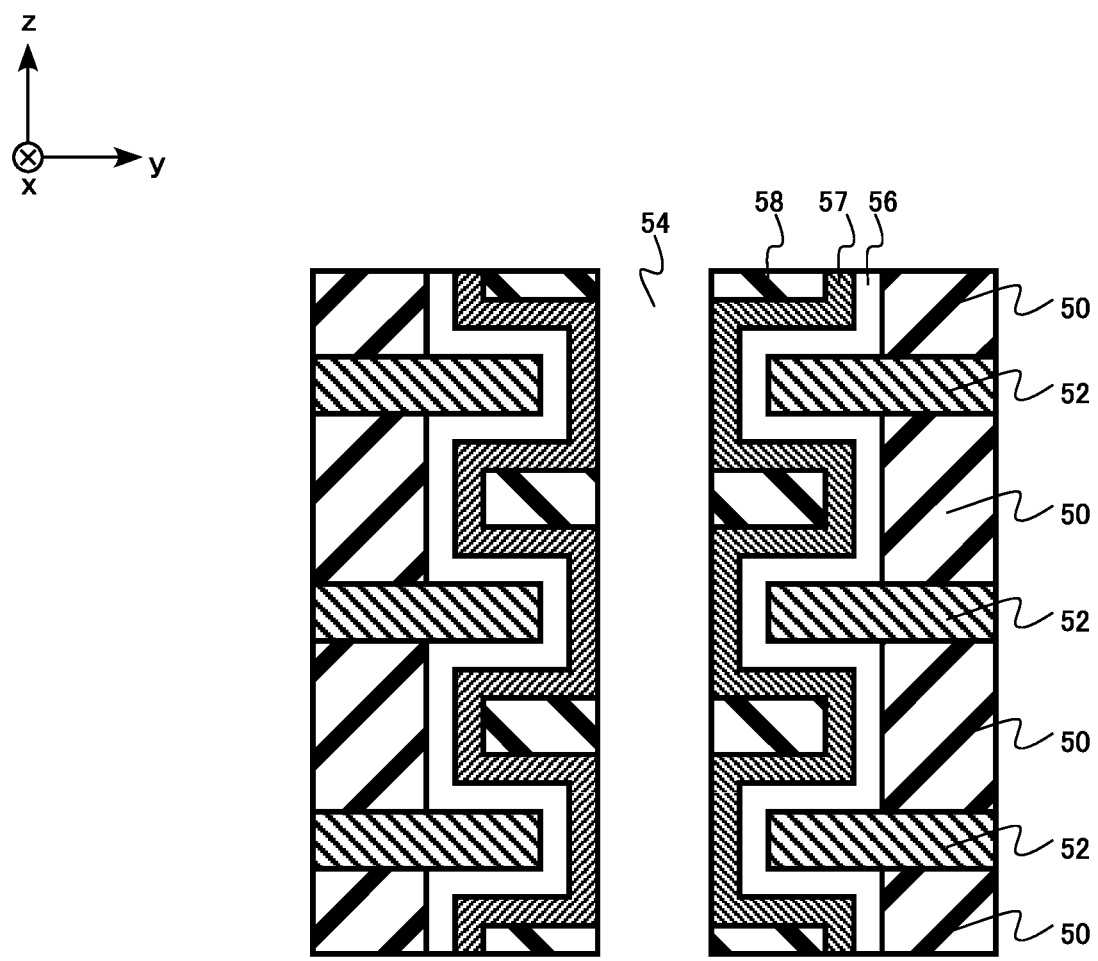
FIG. 22 is a schematic cross-sectional view showing the manufacturing method of the semiconductor memory device of the fourth embodiment.

Next, the silicon oxide film 58 on the inner surface of the opening 54 is removed by etching (FIG. 22). The silicon oxide film 58 is removed by etching with, for example, the RIE method. The silicon oxide film 58 remains on the silicon nitride film 57 in the region where the silicon oxide layer 50 has been retracted. The silicon oxide film 58 eventually becomes the second interlayer insulating layer 18.

Figure 23:
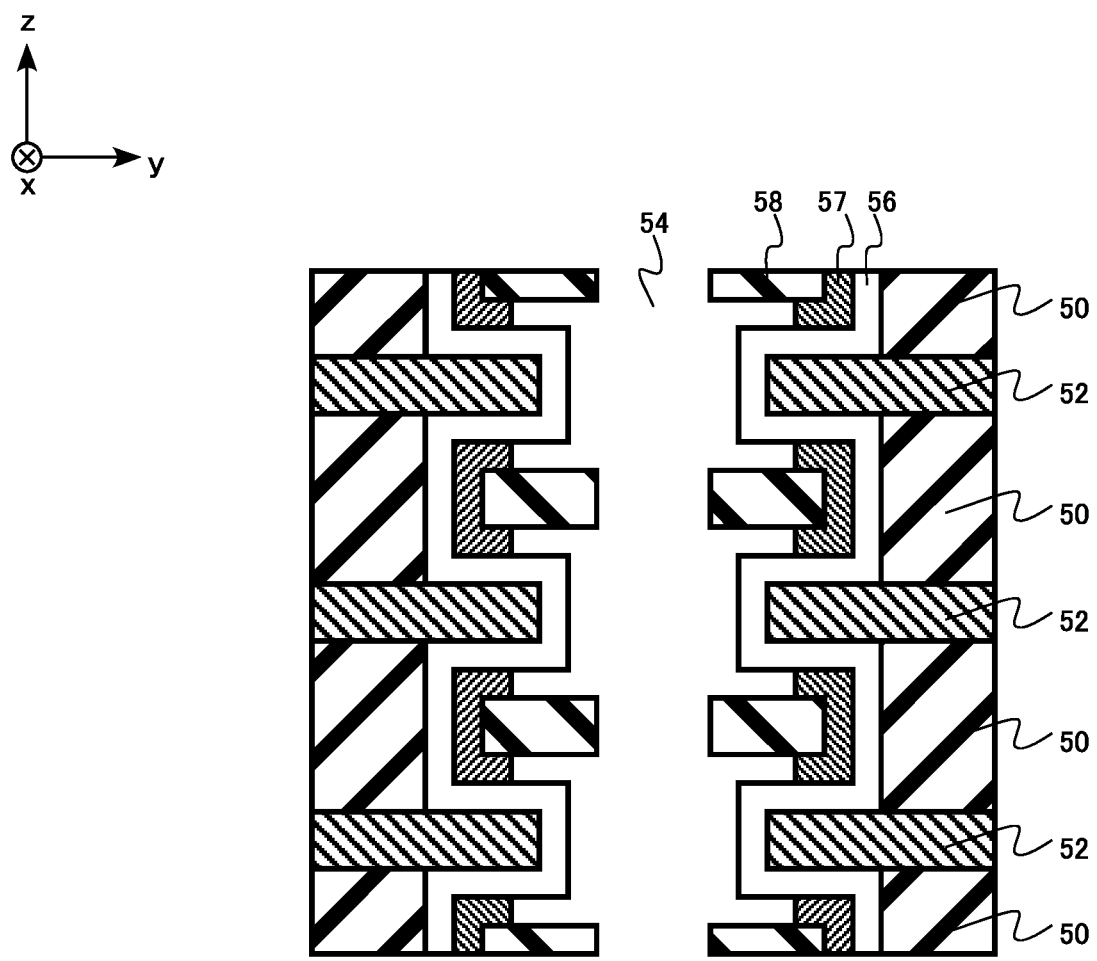
FIG. 23 is a schematic cross-sectional view showing the manufacturing method of the semiconductor memory device of the fourth embodiment.

Next, the silicon nitride film 57 exposed on the inner surface of the opening 54 is selectively retracted by wet etching (FIG. 23). For wet etching, for example, a phosphoric acid solution is used to selectively etch the silicon nitride film 57 with respect to the hafnium oxide film 56 and the silicon oxide film 58.

Next, a titanium nitride film 59 is formed on the inner surface of the opening 54. The titanium nitride film 59 is formed by, for example, the CVD method.

Figure 24:
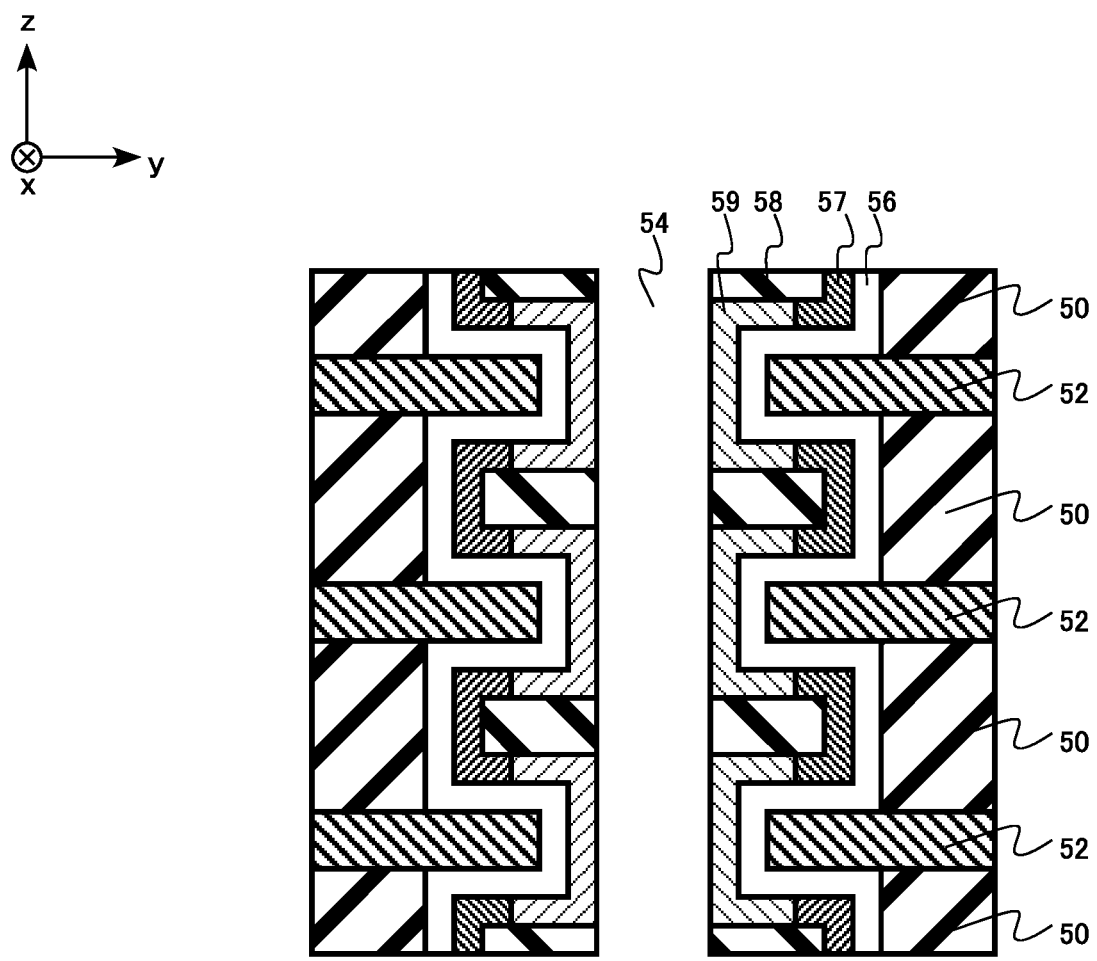
FIG. 24 is a schematic cross-sectional view showing the manufacturing method of the semiconductor memory device of the fourth embodiment.

Next, the titanium nitride film 59 on the inner surface of the opening 54 is removed by etching (FIG. 24). The titanium nitride film 59 is removed by etching with, for example, the RIE method. The titanium nitride film 59 remains on the hafnium oxide film 56 in the region where the silicon nitride film 57 has been retracted. The titanium nitride film 59 eventually becomes the conductive layer 20.

Next, a silicon oxide film 60 is formed on the inner surface of the opening 54. The silicon oxide film 60 is formed by, for example, the CVD method. The silicon oxide film 60 eventually becomes the interface insulating layer 14.

Figure 25:
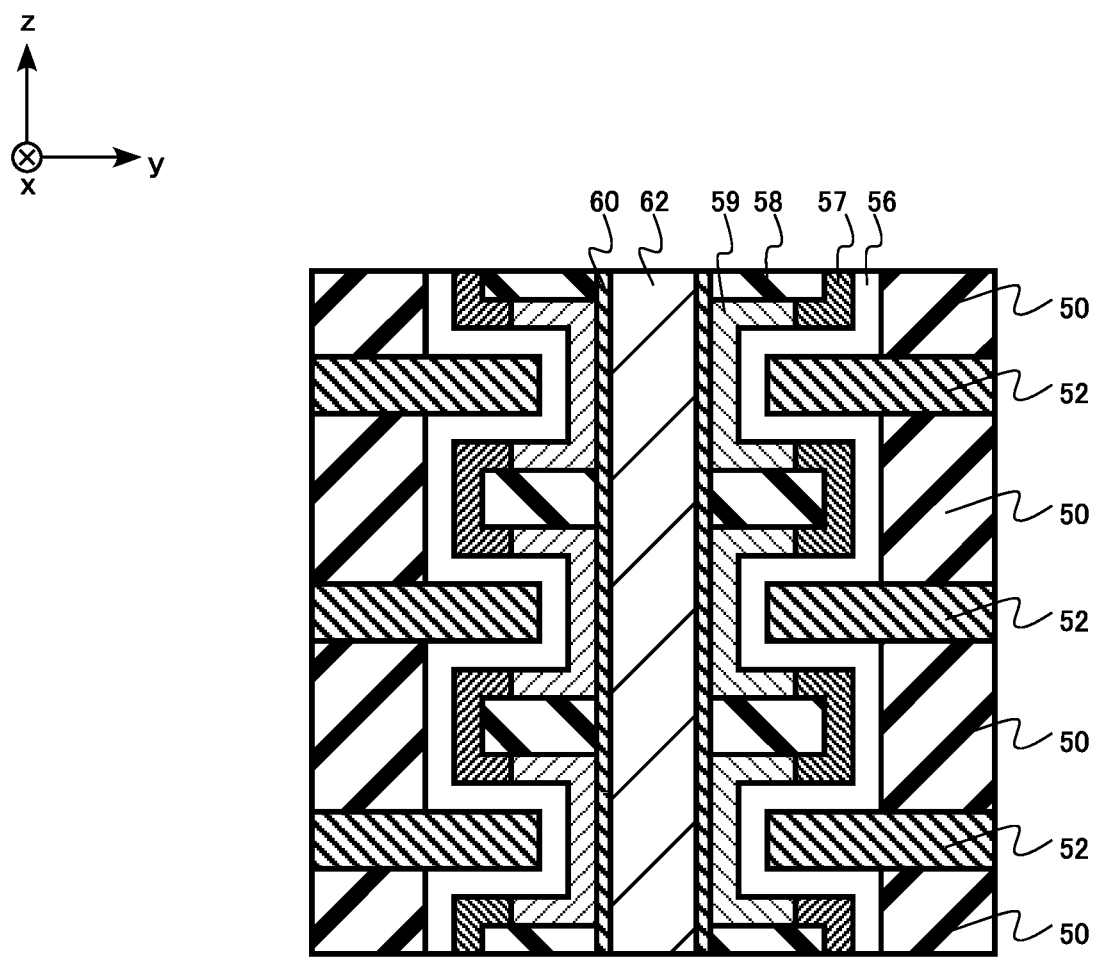
FIG. 25 is a schematic cross-sectional view showing the manufacturing method of the semiconductor memory device of the fourth embodiment.

Next, the polycrystalline silicon film 62 is formed in the opening 54 to fill the opening 54 (FIG. 25). The polycrystalline silicon film 62 is formed by, for example, the CVD method. The polycrystalline silicon film 62 eventually becomes the semiconductor layer 10.

Next, the silicon nitride layer 52 is selectively removed by wet etching using an etching groove not illustrated. For wet etching, for example, a phosphoric acid solution is used to selectively etch the silicon nitride layer 52 with respect to the silicon oxide layer 50 and the hafnium oxide film 56.

Figure 26:
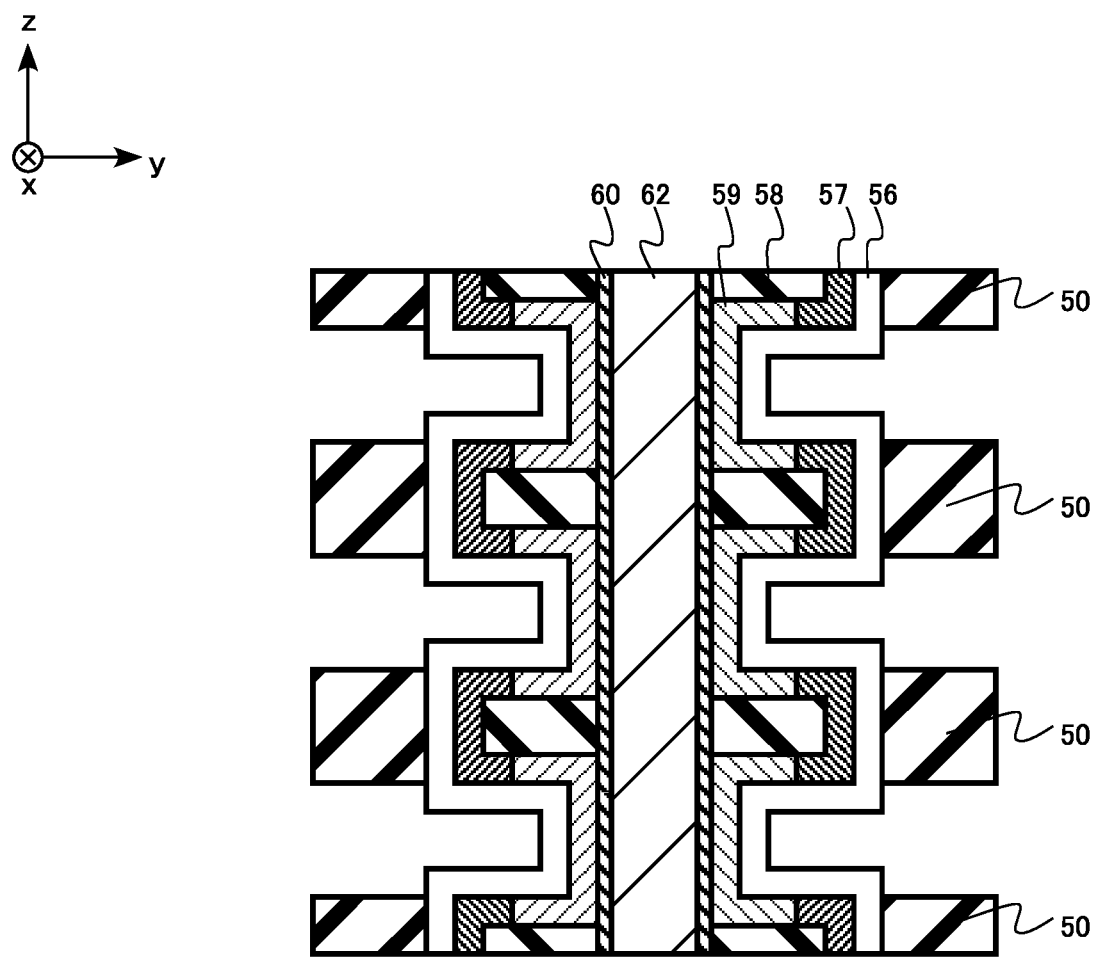
FIG. 26 is a schematic cross-sectional view showing the manufacturing method of the semiconductor memory device of the fourth embodiment.

Next, a part of the silicon oxide layer 50 is removed by wet etching (FIG. 26). For wet etching, for example, a buffered hydrofluoric acid solution is used to perform selective etching the silicon oxide layer 50 with respect to the hafnium oxide film 56.

Figure 27:
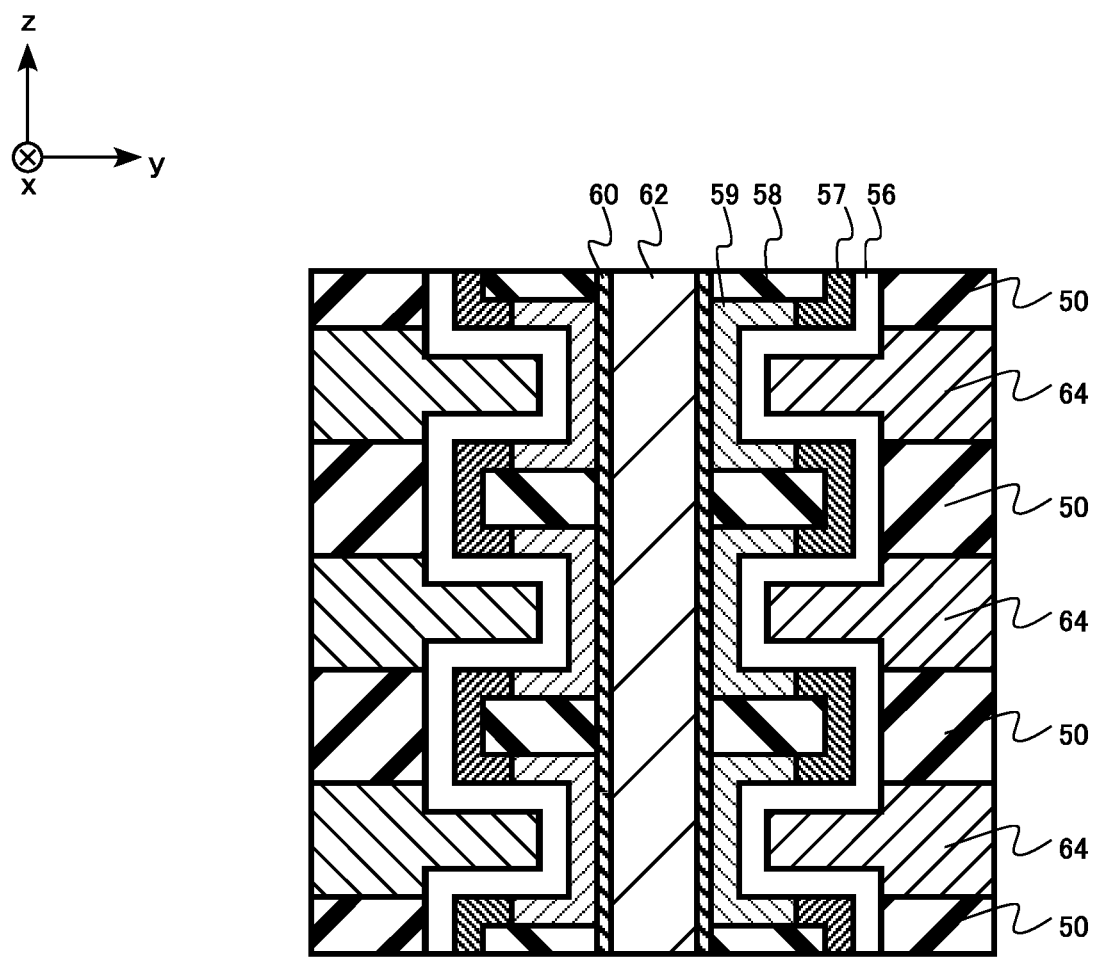
FIG. 27 is a schematic cross-sectional view showing the manufacturing method of the semiconductor memory device of the fourth embodiment.

Next, the tungsten film 64 is formed on the hafnium oxide film 56 (FIG. 27). The tungsten film 64 is formed by, for example, the CVD method. The tungsten film 64 eventually becomes the word line WL.

After the tungsten film 64 is formed, crystallization annealing is performed. By crystallization annealing, the hafnium oxide film 56 becomes ferroelectric.

The semiconductor memory device of the fourth embodiment is manufactured by the above manufacturing method.

Next, the functions and effects of the semiconductor memory device of the fourth embodiment will be described.

The semiconductor memory device of the fourth embodiment is provided with the conductive layer 20 between the first region 12a and the interface insulating layer 14. Therefore, similarly to the semiconductor memory device of the third embodiment, the variation in the threshold voltage of the memory cell transistor MT is suppressed. Similarly to the semiconductor memory device of the third embodiment, the fluctuation of the threshold voltage of the memory cell transistor MT due to the inversion of the polarization state is also suppressed.

In the semiconductor memory device of the fourth embodiment, the conductive layer 20 faces the first word line WL1 in the z direction with the gate insulating layer 12 interposed therebetween. Therefore, it becomes possible to increase the number of crystal grains in contact with the conductive layer 20 among the crystal grains contained in the gate insulating layer 12. Therefore, it becomes possible to further average variations in the polarization state of the crystal grains.

The conductive layer 20 has a bent structure including the first end 20a, the second end 20b, and the center portion 20c. Due to the structure in which the gate insulating layer 12 is sandwiched between the conductive layer 20 having the bent structure and the word line WL, the size of the crystal grains of the gate insulating layer 12 can be reduced by the shape effect of the conductive layer 20 during the crystallization annealing. By reducing the size of the crystal grains, it becomes possible to further average variations in the polarization state of the crystal grains.

According to the semiconductor memory device of the fourth embodiment, as compared with the semiconductor memory device of the third embodiment, it becomes possible to further average variations in the polarization state of the crystal grains. Therefore, variation in the threshold voltage of the memory cell transistor MT and fluctuation in the threshold voltage of the memory cell transistor MT due to inversion of the polarization state are further suppressed.

In the semiconductor memory device of the fourth embodiment, the distance (L1 in FIG. 18) between the second region 12b and the semiconductor layer 10 is larger than the distance (L2 in FIG. 18) between the first region 12a and the semiconductor layer 10. Therefore, similarly to the semiconductor memory device of the first embodiment, the current flowing through the semiconductor layer between the word line WL and the word line WL is stabilized, and the stable operation of the memory cell can be performed.

The first word line WL1 includes the wide portion WL1a and the narrow portion WL1b. The length (L3 in FIG. 18) of the narrow portion WL1b in the z direction is shorter than the length (L4 in FIG. 18) of the wide portion WL1a in the z direction. Therefore, it becomes easy to form the second interlayer insulating layer 18 and the intermediate insulating layer 22 filling between the first word line WL1 and the second word line WL2.

As described above, according to the semiconductor memory device of the fourth embodiment, the current flowing through the semiconductor layer between the word line WL and the word line WL is stabilized, and the stable operation of the memory cell can be performed. By providing the conductive layer, variation and fluctuation in the threshold voltage of the memory cell transistor are suppressed. Therefore, it is possible to achieve a stably operating semiconductor memory device.

Fifth Embodiment

The semiconductor memory device of the fifth embodiment is different from the semiconductor memory device of the fourth embodiment in that the gate electrode layer further includes a fourth portion facing the conductive layer in the first direction and a fifth portion facing the conductive layer in the first direction, and the conductive layer is provided between the fourth portion and the fifth portion. Hereinafter, part of description of the contents overlapping the fourth embodiment may be omitted.

The semiconductor memory device of the fifth embodiment is a three-dimensional NAND flash memory having a memory cell of the MFMIS structure.

Figure 28:
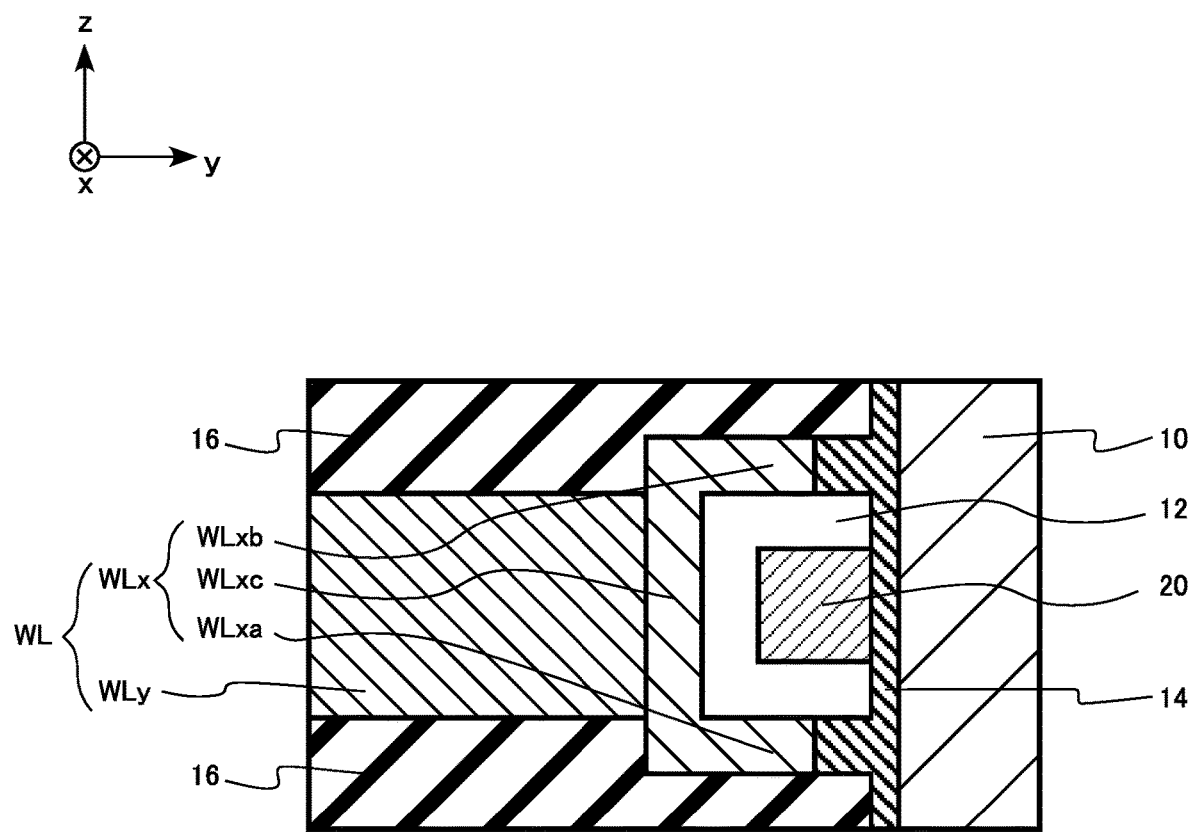
FIG. 28 is a schematic cross-sectional view of a memory cell of a semiconductor memory device of a fifth embodiment.

FIG. 28 is a schematic cross-sectional view of the memory cell of the semiconductor memory device of the fifth embodiment. FIG. 28 is an enlarged cross-sectional view of a part of a memory cell.

As shown in FIG. 28, the memory cell includes the word line WL, the semiconductor layer 10, the gate insulating layer 12, the interface insulating layer 14, the first interlayer insulating layer 16, and the conductive layer 20.

The word line WL is an example of the gate electrode layer. The interface insulating layer 14 is an example of the insulating layer.

The word line WL includes a tip end WLx and a main portion WLy. The tip end WLx includes a first end WLxa, a second end WLxb, and a center portion WLxc.

The first end WLxa is an example of the fourth portion. The second end WLxb is an example of the fifth portion.

The first end WLxa is provided between the gate insulating layer 12 and the first interlayer insulating layer 16. The second end WLxb is provided between the gate insulating layer 12 and the first interlayer insulating layer 16. The second end WLxb is disposed in the z direction of the first end WLxa.

The center portion WLxc is disposed between the gate insulating layer 12 and the word line WL. The center portion WLxc is provided between the first end WLxa and the second end WLxb.

The conductive layer 20 is provided between the first end WLxa and the second end WLxb.

The tip end WLx is a conductor. The tip end WLx is, for example, a metal, a metal nitride, or a metal oxide. The tip end WLx is, for example, titanium, titanium nitride, titanium oxide, tantalum, tantalum nitride, tantalum oxide, tungsten, tungsten nitride, or tungsten oxide.

The main portion WLy is a conductor. The main portion WLy is, for example, a metal, a metal nitride, a metal carbide, or a semiconductor. The word line WL is tungsten (W), for example.

The material of the tip end WLx and the material of the main portion WLy may be the identical or different.

The conductive layer 20 is provided between the gate insulating layer 12 and the interface insulating layer 14. The conductive layer 20 faces the word line WL in the y direction with the gate insulating layer 12 interposed therebetween. The conductive layer 20 is an example of the second portion.

The conductive layer 20 comes into contact with, for example, the interface insulating layer 14.

The conductive layer 20 faces the word line WL in the z direction with the gate insulating layer 12 interposed therebetween. The conductive layer 20 faces the tip end WLx of the word line WL in the z direction with the gate insulating layer 12 interposed therebetween.

A part of the conductive layer 20 faces the first end WLxa in the z direction with the gate insulating layer 12 interposed therebetween. Another part of the conductive layer 20 faces the second end WLxb in the z direction with the gate insulating layer 12 interposed therebetween. A part of the conductive layer 20 or another part of the conductive layer 20 is an example of the first portion.

The conductive layer 20 is a conductor. The conductive layer 20 is, for example, a metal, a metal nitride, or a metal oxide. The conductive layer 20 is, for example, titanium, titanium nitride, titanium oxide, tantalum, tantalum nitride, tantalum oxide, tungsten, tungsten nitride, or tungsten oxide.

The thickness of the conductive layer 20 in the y direction is larger than the thickness of the interface insulating layer 14 in the y direction, for example.

Next, an example of the manufacturing method of the semiconductor memory device of the fifth embodiment will be described. FIGS. 29 to 34 are schematic cross-sectional views showing the manufacturing method of the semiconductor memory device of the fifth embodiment.

First, a silicon oxide layer 50 and a silicon nitride layer 52 are alternately stacked on a semiconductor substrate not illustrated. The silicon oxide layer 50 and the silicon nitride layer 52 form the stack body 30. The silicon oxide layer 50 and the silicon nitride layer 52 are formed by, for example, the CVD method. A part of the silicon oxide layer 50 eventually becomes the first interlayer insulating layer 16.

Figure 29:
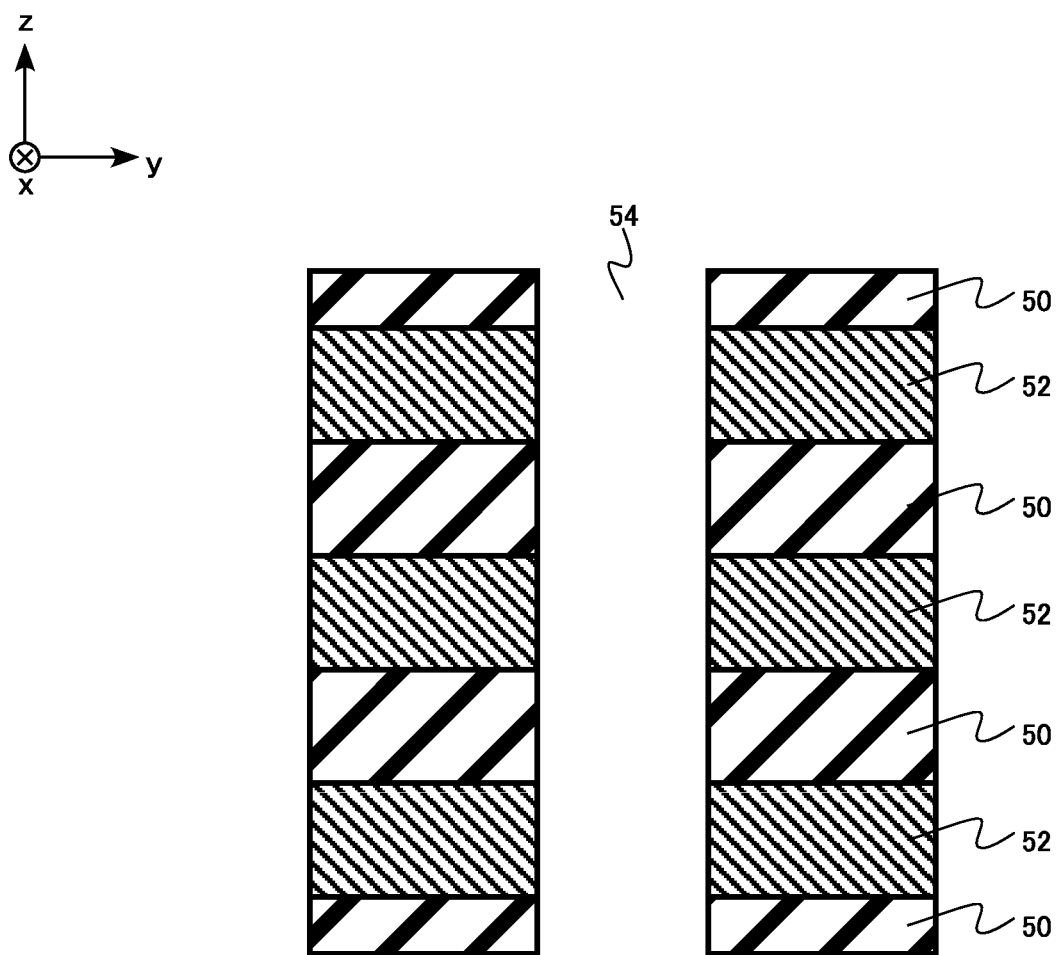
FIG. 29 is a schematic cross-sectional view showing a manufacturing method of the semiconductor memory device of the fifth embodiment.

Next, the opening 54 is formed in the silicon oxide layer 50 and the silicon nitride layer 52 (FIG. 29). The opening 54 is formed by, for example, the lithography method and the RIE method.

Figure 30:
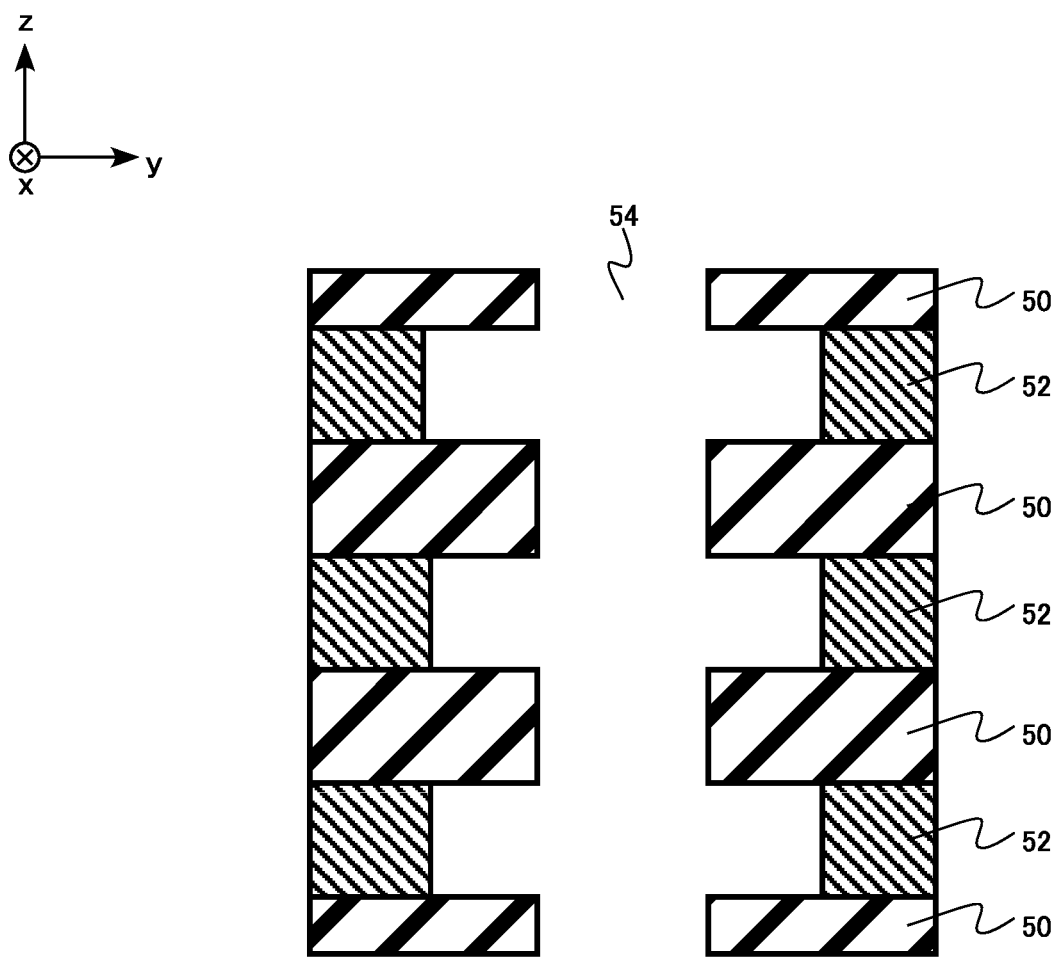
FIG. 30 is a schematic cross-sectional view showing the manufacturing method of the semiconductor memory device of the fifth embodiment.

Next, the silicon nitride layer 52 exposed on the inner surface of the opening 54 is selectively retracted by wet etching (FIG. 30). For wet etching, for example, a phosphoric acid solution is used to selectively etch the silicon nitride layer 52 with respect to the silicon oxide layer 50.

Figure 31:
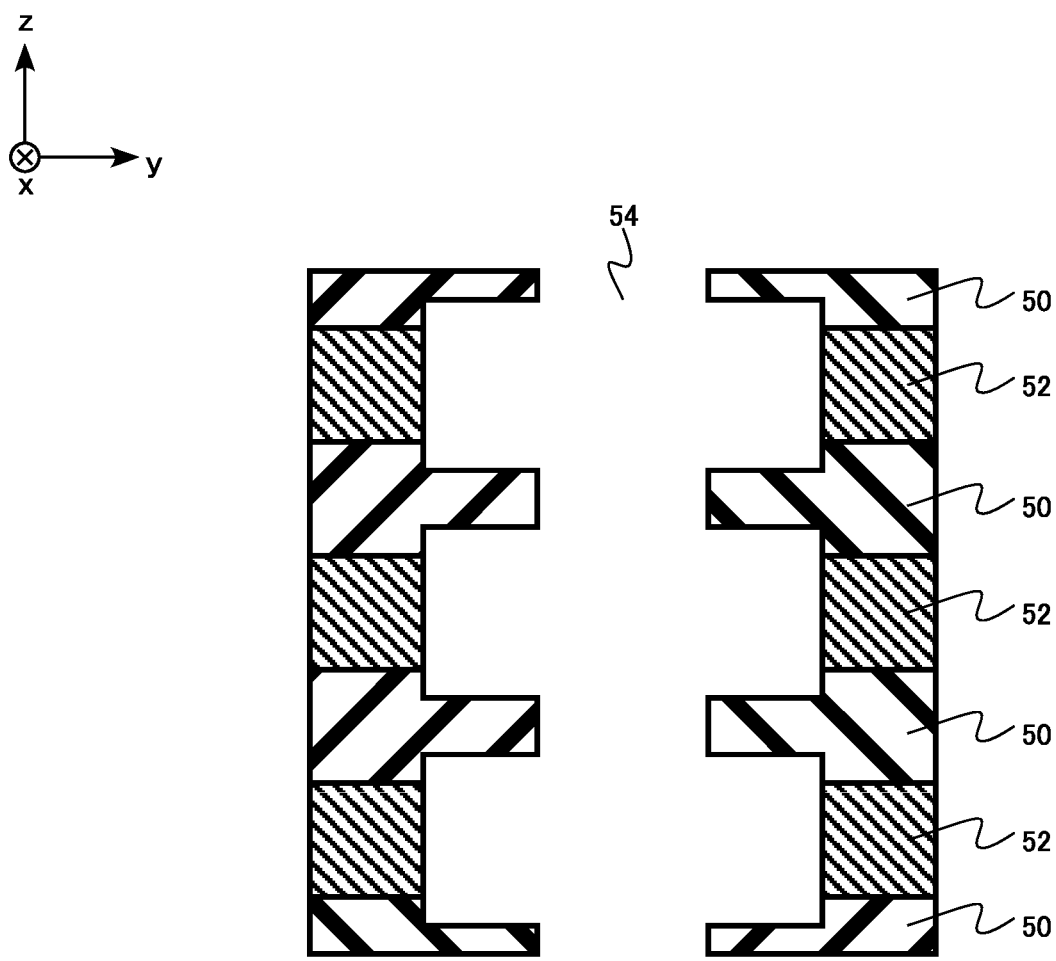
FIG. 31 is a schematic cross-sectional view showing the manufacturing method of the semiconductor memory device of the fifth embodiment.

Next, a part of the silicon oxide layer 50 is removed by wet etching (FIG. 31). For wet etching, for example, a buffered hydrofluoric acid solution is used to perform selective etching the silicon oxide layer 50 with respect to the silicon nitride layer 52.

Next, the titanium nitride film 53, the hafnium oxide film 56, and the titanium oxide film 55 are formed in the opening 54. The titanium nitride film 53 is formed by, for example, the CVD method. The hafnium oxide film 56 is formed by, for example, the ALD method. For example, as an additive element, silicon (Si) is added to the hafnium oxide film 56. The titanium oxide film 55 is formed by, for example, the CVD method.

Figure 32:
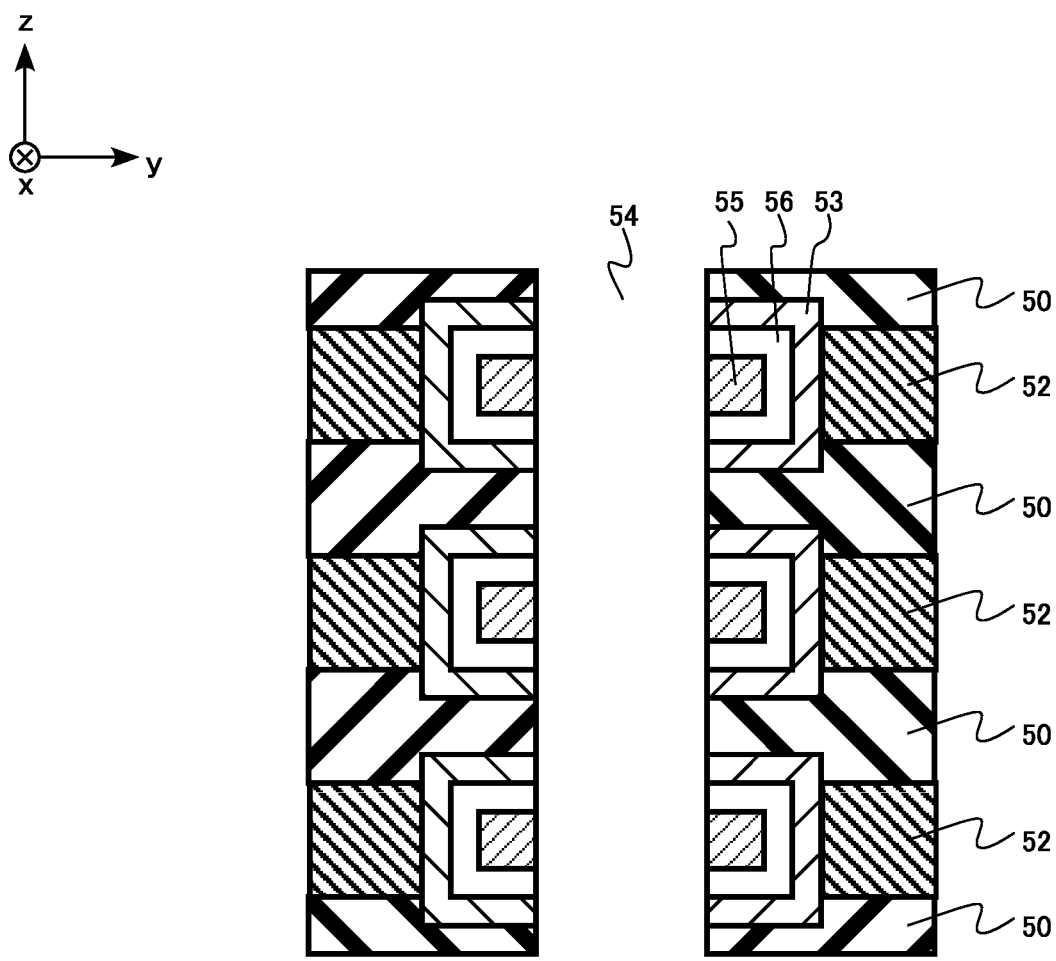
FIG. 32 is a schematic cross-sectional view showing the manufacturing method of the semiconductor memory device of the fifth embodiment.

Next, the titanium oxide film 55, the hafnium oxide film 56, and the titanium nitride film 53 on the inner surface of the opening 54 are removed by etching (FIG. 32). The titanium oxide film 55, the hafnium oxide film 56, and the titanium nitride film 53 are removed by etching with, for example, the RIE method. The titanium oxide film 55 eventually becomes the conductive layer 20. The hafnium oxide film 56 eventually becomes the gate insulating layer 12. The titanium nitride film 53 eventually becomes the tip end WLx of the word line WL.

Figure 33:
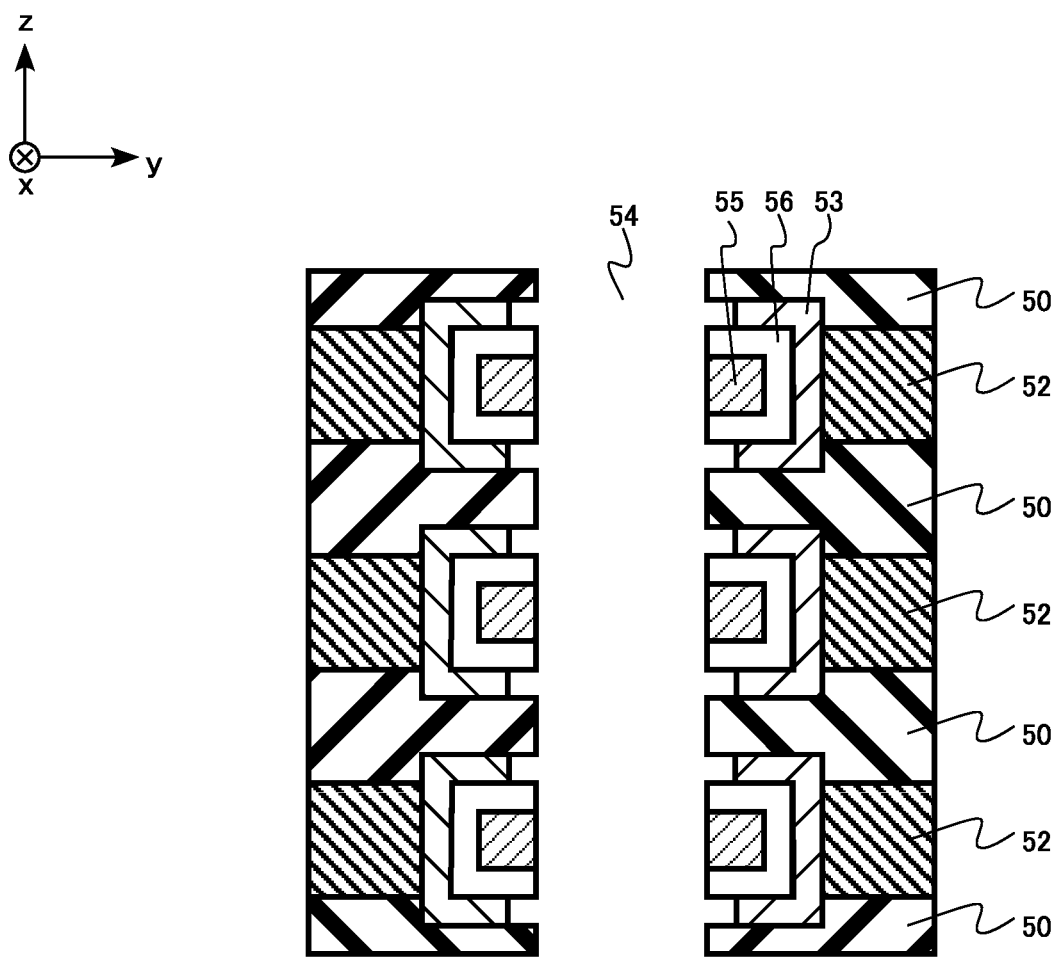
FIG. 33 is a schematic cross-sectional view showing the manufacturing method of the semiconductor memory device of the fifth embodiment.

Next, the titanium nitride film 53 exposed on the inner surface of the opening 54 is selectively retracted by etching (FIG. 33). The titanium nitride film 53 is selectively etched with respect to the silicon oxide layer 50, the hafnium oxide film 56, and the titanium oxide film 55.

Next, a silicon oxide film 60 is formed on the inner surface of the opening 54. The silicon oxide film 60 is formed by, for example, the CVD method. The silicon oxide film 60 eventually becomes the interface insulating layer 14.

Next, the polycrystalline silicon film 62 is formed in the opening 54 to fill the opening 54. The polycrystalline silicon film 62 is formed by, for example, the CVD method. The polycrystalline silicon film 62 eventually becomes the semiconductor layer 10.

Next, the silicon nitride layer 52 is selectively removed by wet etching using an etching groove not illustrated. For wet etching, for example, a phosphoric acid solution is used to selectively etch the silicon nitride layer 52 with respect to the silicon oxide layer 50 and the titanium nitride film 53.

Figure 34:
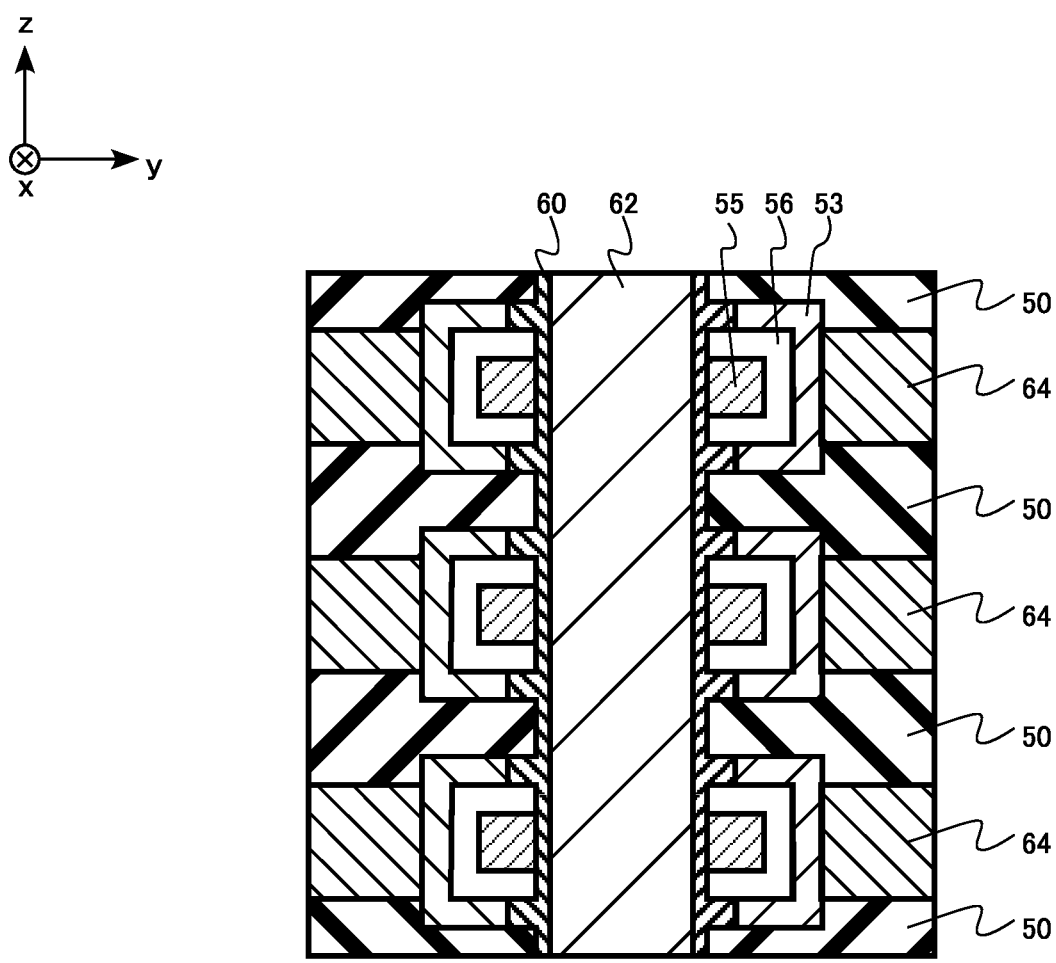
FIG. 34 is a schematic cross-sectional view showing the manufacturing method of the semiconductor memory device of the fifth embodiment.

Next, the tungsten film 64 is formed on the titanium nitride film 53 (FIG. 34). The tungsten film 64 is formed by, for example, the CVD method. The tungsten film 64 is connected to the titanium nitride film 53, and eventually becomes the main portion WLy of the word line WL.

After the tungsten film 64 is formed, crystallization annealing is performed. By crystallization annealing, the hafnium oxide film 56 becomes ferroelectric.

The semiconductor memory device of the fifth embodiment is manufactured by the above manufacturing method.

The semiconductor memory device of the fifth embodiment is provided with the conductive layer 20 between the gate insulating layer 12 and the interface insulating layer 14. In the semiconductor memory device of the fifth embodiment, the conductive layer 20 faces the word line WL in the z direction with the gate insulating layer 12 interposed therebetween. Therefore, similarly to the semiconductor memory device of the fourth embodiment, it becomes possible to further average variations in the polarization state of the crystal grains. Therefore, similarly to the semiconductor memory device of the fourth embodiment, the variation in the threshold voltage of the memory cell transistor MT is suppressed. Similarly to the semiconductor memory device of the fourth embodiment, the fluctuation of the threshold voltage of the memory cell transistor MT due to the inversion of the polarization state is also suppressed.

As described above, according to the semiconductor memory device of the fifth embodiment, by providing the conductive layer, the variation and the fluctuation in the threshold voltage of the memory cell transistor are suppressed. Therefore, it is possible to achieve a stably operating semiconductor memory device.

In the first to fifth embodiments, the case where the word line WL is a plate-shaped conductor and the semiconductor layer 10 is surrounded by the word line WL has been described by way of example. However, for example, it is also possible to adopt a memory cell array structure in which the word line WL has a linear shape extending in the y direction, and a part of the semiconductor layer 10 and the word line WL face each other. A structure in which an insulating layer extending in the z direction is provided inside the semiconductor layer 10, and this insulating layer is surrounded by the semiconductor layer 10 may be adopted. As a material of this insulating layer, for example, silicon oxide or the like is used.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor layer extending in a first direction;
   a first gate electrode layer;
   a second gate electrode layer provided apart from the first gate electrode layer in the first direction; and
   a gate insulating layer containing oxygen (O) and at least one metal element of hafnium (Hf) or zirconium (Zr), the gate insulating layer including a first region, a second region, and a third region, the first region provided between the first gate electrode layer and the semiconductor layer, the second region provided between the first gate electrode layer and the second gate electrode layer, and the third region provided between the second gate electrode layer and the semiconductor layer, the first region including a crystal of an orthorhombic crystal system or a trigonal crystal system as a main constituent substance, and a distance between the second region and the semiconductor layer being larger than a distance between the first region and the semiconductor layer,
   wherein the first gate electrode layer includes a first portion and a second portion closer to the semiconductor layer than the first portion, and a length of the second portion in the first direction is shorter than a length of the first portion in the first direction.

2. The semiconductor memory device according to claim 1, wherein the second region includes a crystal of an orthorhombic crystal system or a trigonal crystal system as a main constituent substance.

3. The semiconductor memory device according to claim 1 further comprising: a first insulating layer provided between the gate insulating layer and the semiconductor layer and made of a material different from a material of the gate insulating layer.

4. The semiconductor memory device according to claim 3 further comprising: a conductive layer provided between the first region and the first insulating layer.

5. The semiconductor memory device according to claim 3 further comprising: a second insulating layer provided between the second region and the first insulating layer and made of a material different from a material of the gate insulating layer.

6. The semiconductor memory device according to claim 1, wherein a thickness of the second region is thinner than a thickness of the first region.

7. The semiconductor memory device according to claim 1, wherein a main constituent substance of the second region is other than a crystal of an orthorhombic crystal system and a trigonal crystal system.

8. The semiconductor memory device according to claim 1, wherein the third region includes a crystal of the orthorhombic crystal system or the trigonal crystal system as a main constituent substance.

9. The semiconductor memory device according to claim 1, wherein the first region is a ferroelectric.

* * * * *